United States Patent
Hai et al.

(10) Patent No.: US 12,105,306 B2
(45) Date of Patent: Oct. 1, 2024

(54) TEXTURE IMAGE ACQUIRING DEVICE, DISPLAY DEVICE, AND COLLIMATOR

(71) Applicant: BOE TECHNOLOGY GROUP CO., LTD., Beijing (CN)

(72) Inventors: Xiaoquan Hai, Beijing (CN); Xue Dong, Beijing (CN); Haisheng Wang, Beijing (CN); Lei Wang, Beijing (CN); Yingzi Wang, Beijing (CN); Xiandong Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/301,485

(22) Filed: Apr. 17, 2023

(65) Prior Publication Data

US 2023/0251404 A1    Aug. 10, 2023

Related U.S. Application Data

(63) Continuation of application No. 16/767,254, filed as application No. PCT/CN2019/103794 on Aug. 30, 2019.

(51) Int. Cl.
*G02B 5/00*     (2006.01)
*G02B 27/09*    (2006.01)
(Continued)

(52) U.S. Cl.
CPC ......... *G02B 5/005* (2013.01); *G02B 27/0961* (2013.01); *G02B 27/0988* (2013.01);
(Continued)

(58) Field of Classification Search
CPC ............... G02B 5/005; G02B 27/0961; G02B 27/0988; G02B 27/30; G02B 27/0018;
(Continued)

(56) References Cited

U.S. PATENT DOCUMENTS 10,489,630 B2    11/2019   Wu et al.
10,558,014 B2    2/2020    Kwak et al.
(Continued)

FOREIGN PATENT DOCUMENTS

CN    102959470 A    3/2013
CN    107515435 A    12/2017
(Continued)

OTHER PUBLICATIONS

English Machine Translation of WO 2020/206,894 Wu et al (Year: 2023).*

(Continued)

*Primary Examiner* — Donald L Raleigh
(74) *Attorney, Agent, or Firm* — Collard & Roe, P.C.; William Collard

(57) ABSTRACT

A texture image acquiring device, a display device and a collimator are disclosed. The texture image acquiring device includes a collimator and an image sensor. The collimator includes a lens array and diaphragm component. The diaphragm component includes a first diaphragm layer and a second diaphragm layer. The lens array is configured to allow light rays to be converged and incident on the diaphragm component. The diaphragm component is configured to allow light rays to pass through, and to restrict an angle of light rays capable of passing through the diaphragm component. The image sensor is configured to sense light rays incident on the image sensor for acquiring a texture image.

18 Claims, 14 Drawing Sheets

(51) Int. Cl.
  *G02B 27/30* (2006.01)
  *G02F 1/1333* (2006.01)
  *G02F 1/1335* (2006.01)
  *G06V 40/13* (2022.01)
  *H04N 23/55* (2023.01)
  *H10K 59/65* (2023.01)

(52) U.S. Cl.
  CPC ......... *G02B 27/30* (2013.01); *G02F 1/13338* (2013.01); *G02F 1/133526* (2013.01); *G06V 40/1318* (2022.01); *H04N 23/55* (2023.01); *H10K 59/65* (2023.02)

(58) Field of Classification Search
  CPC ............... G02B 3/0056; G02F 1/13338; G02F 1/133526; G02F 1/13312; G06V 40/1318; H04N 23/55; H10K 59/65; H01L 27/14678
  See application file for complete search history.

(56) References Cited

U.S. PATENT DOCUMENTS

| | | | |
|---|---|---|---|
| 11,275,922 | B2 | 3/2022 | Du |
| 11,403,869 | B2 | 8/2022 | Wu et al. |
| 2005/0122418 | A1 | 6/2005 | Okita et al. |
| 2009/0179142 | A1 | 7/2009 | Duparre et al. |
| 2010/0061090 | A1* | 3/2010 | Bergman ............... F21V 5/007 362/231 |
| 2010/0151761 | A1 | 6/2010 | Miyazaki et al. |
| 2017/0192156 | A1 | 7/2017 | Song et al. |
| 2018/0233531 | A1 | 8/2018 | Huang et al. |
| 2019/0072252 | A1* | 3/2019 | Moser ..................... F21S 41/68 |
| 2019/0080138 | A1 | 3/2019 | Gao et al. |
| 2019/0179488 | A1 | 6/2019 | Klenkler et al. |
| 2019/0180072 | A1 | 6/2019 | Fomani et al. |
| 2020/0293738 | A1 | 9/2020 | Zhang et al. |
| 2020/0293740 | A1 | 9/2020 | Yao et al. |
| 2020/0327296 | A1* | 10/2020 | Wu ........................ H01L 24/48 |

FOREIGN PATENT DOCUMENTS

| | | | |
|---|---|---|---|
| CN | 108681703 | A | 10/2018 |
| CN | 109791612 | A | 5/2019 |
| CN | 208848221 | U | 5/2019 |
| CN | 109858465 | A | 6/2019 |
| CN | 110023956 | A | 7/2019 |
| CN | 110073264 | A | 7/2019 |
| CN | 110084090 | A | 8/2019 |
| CN | 110088768 | A | 8/2019 |
| CN | 111213152 | A | 5/2020 |
| JP | 2015114407 | A | 6/2015 |
| JP | 2017120778 | A | 7/2017 |
| TW | 202109355 | A | 3/2021 |
| WO | 2017/129126 | A1 | 8/2017 |
| WO | 2018/024118 | A1 | 2/2018 |
| WO | WO-2020206894 | A1 * | 10/2020 ........... G02B 3/0056 |

OTHER PUBLICATIONS

International Search Report of PCT/CN2019/103794 in Chinese, mailed Mar. 27, 2020 with English translation.
Notice of Transmittal of the International Search Report of PCT/CN2019/103794 in Chinese, mailed Mar. 27, 2020.
Written Opinion of the International Searching Authority of PCT/CN2019/103794 in Chinese, mailed Mar. 27, 2020.
Extended European Search Report in European Application No. 19932219.9 dated Aug. 3, 2022.
U.S. Notice of Allowance in U.S. Appl. No. 16/767,254 dated May 2, 2023.
U.S. Office Action in U.S. Appl. No. 16/767,254 dated May 12, 2022.
U.S. Office Action in U.S. Appl. No. 16/767,254 dated Sep. 30, 2022.
Japanese Patent Office Action in Japanese Application No. 2020-572406 dated Jul. 18, 2023 with English translation.
European Office Action in European Application No. 19932219.9 dated Jul. 23, 2024.

* cited by examiner

TEXTURE IMAGE ACQUIRING DEVICE, DISPLAY DEVICE, AND COLLIMATOR

CROSS-REFERENCE TO RELATED APPLICATION

The present application is a continuation of U.S. application Ser. No. 16/767,254, filed May 27, 2020, which claims the benefit of U.S. National Phase Entry of International Application No. PCT/CN2019/103794 filed on Aug. 30, 2019. The present application claims priority to and the benefit of the above-identified applications and the above-identified applications are incorporated by reference herein in their entirety.

TECHNICAL FIELD

Embodiments of the present disclosure relate to a texture image acquiring device, a display device, and a collimator.

BACKGROUND

With the increasing popularity of mobile terminals, more and more users use mobile terminals for authentication, electronic payment, and other operations. Because of the uniqueness of the skin texture pattern, the fingerprint recognition technology and the palm print recognition technology combined with optical imaging are gradually adopted by mobile electronic devices for authentication, electronic payment, and the like.

SUMMARY

At least one embodiment of the present disclosure provides a texture image acquiring device, which comprises a collimator and an image sensor. The collimator is stacked on the image sensor, the collimator comprises a lens array, a first diaphragm layer, and a second diaphragm layer which are sequentially stacked, and the second diaphragm layer is adjacent to the image sensor. The lens array is configured to allow light rays to be converged and incident on the first diaphragm layer. The first diaphragm layer is configured to allow light rays incident on the first diaphragm layer to pass through and be incident on the second diaphragm layer, and to restrict an angle of light rays capable of passing through the first diaphragm layer. The second diaphragm layer is configured to allow light rays incident on the second diaphragm layer to pass through, and to restrict an angle of light rays capable of passing through the second diaphragm layer. The image sensor is configured to sense light rays incident on the image sensor for acquiring a texture image.

For example, in the texture image acquiring device provided by at least one embodiment of the present disclosure, the lens array comprises a plurality of lens units arranged in an array, the first diaphragm layer comprises a plurality of first through holes arranged in an array, and the plurality of lens units and the plurality of first through holes overlap in a one-to-one correspondence in a direction perpendicular to the first diaphragm layer.

For example, in the texture image acquiring device provided by at least one embodiment of the present disclosure, a relationship between a radius of curvature R, an aperture D and an arch height h of at least one of the lens units satisfies a formula of $R=D^2/(8*h)+h/2$.

For example, in the texture image acquiring device provided by at least one embodiment of the present disclosure, the collimator has a thickness of less than 100 µm, an aperture of at least one of the lens units ranges from 1 µm to 40 µm, and an opening diameter of at least one of the first through holes ranges from 1 µm to 20 µm.

For example, in the texture image acquiring device provided by at least one embodiment of the present disclosure, the second diaphragm layer comprises a plurality of second through holes arranged in an array, and the plurality of second through holes and the plurality of first through holes overlap in a one-to-one correspondence in the direction perpendicular to the first diaphragm layer.

For example, in the texture image acquiring device provided by at least one embodiment of the present disclosure, a first through hole has a first opening center, a second through hole has a second opening center, and the first opening center of the first through hole overlaps with a second opening center of a second through hole corresponding to the first through hole in a direction perpendicular to the image sensor.

For example, in the texture image acquiring device provided by at least one embodiment of the present disclosure, an opening diameter of a first through hole is greater than or equal to an opening diameter of a second through hole corresponding to the first through hole.

For example, in the texture image acquiring device provided by at least one embodiment of the present disclosure, a number of the plurality of lens units, a number of the plurality of first through holes, and a number of the plurality of second through holes are equal.

For example, in the texture image acquiring device provided by at least one embodiment of the present disclosure, a first through hole has a first opening center, and the first opening center is located at a focal point of a lens unit corresponding to the first through hole.

For example, in the texture image acquiring device provided by at least one embodiment of the present disclosure, the collimator further comprises a first filling layer that is transparent and between the lens array and the first diaphragm layer, and a second filling layer that is transparent and between the first diaphragm layer and the second diaphragm layer.

For example, in the texture image acquiring device provided by at least one embodiment of the present disclosure, a thickness of the first filling layer is equal to a focal length of a lens unit.

For example, in the texture image acquiring device provided by at least one embodiment of the present disclosure, a ratio of a thickness of the first filling layer to a thickness of the second filling layer ranges from 4 to 6.

For example, the texture image acquiring device provided by at least one embodiment of the present disclosure further comprises an intermediate medium. The intermediate medium is between the image sensor and the collimator, and the intermediate medium is configured to bond the image sensor and the collimator, and to adjust a distance between the image sensor and the collimator in a direction perpendicular to the image sensor.

For example, in the texture image acquiring device provided by at least one embodiment of the present disclosure, the plurality of lens units are arranged in a hexagonal array.

For example, the texture image acquiring device provided by at least one embodiment of the present disclosure further comprises a third diaphragm layer. The third diaphragm layer is between the second diaphragm layer and the image sensor, and is configured to allow light rays to pass through and be incident on the image sensor, and to restrict an angle of light rays capable of passing through the third diaphragm layer.

At least one embodiment of the present disclosure further provides a display device, which comprises a display panel and the above-described texture image acquiring device which is stacked with the display panel. The display panel comprises a display side and a back side which is opposite to the display side, the texture image acquiring device is on the back side of the display panel, and the collimator is between the display panel and the image sensor. The texture image acquiring device is configured to detect light rays which are reflected by an object texture on the display side of the display panel and pass through the display panel.

For example, in the display device provided by at least one embodiment of the present disclosure, the display panel comprises a display region and a peripheral region. The collimator and the image sensor are in the display region of the display panel and on the back side of the display panel.

For example, the display device provided by at least one embodiment of the present disclosure further comprises an adhesive frame. The adhesive frame is between the display panel and the collimator, and the adhesive frame is in the peripheral region of the display panel and on the back side of the display panel.

For example, the display device provided by at least one embodiment of the present disclosure further comprises a filling medium. The filling medium is between the display panel and the collimator and fills a gap between the back side of the display panel and the lens array of the collimator.

For example, in the display device provided by at least one embodiment of the present disclosure, the display panel comprises an organic light emitting diode display panel, a quantum dot light emitting diode display panel, or a liquid crystal display panel.

At least one embodiment of the present disclosure further provides a collimator, which comprises a lens array, a first diaphragm layer, and a second diaphragm layer which are sequentially stacked. The lens array is configured to allow light rays to be converged and incident on the first diaphragm layer, the first diaphragm layer is configured to allow light rays incident on the first diaphragm layer to pass through and be incident on the second diaphragm layer, and to restrict an angle of light rays capable of passing through the first diaphragm layer, and the second diaphragm layer is configured to allow light rays incident on the second diaphragm layer to pass through, and to restrict an angle of light rays capable of passing through the second diaphragm layer.

For example, in the collimator provided by at least one embodiment of the present disclosure, the lens array comprises a plurality of lens units arranged in an array, the first diaphragm layer comprises a plurality of first through holes arranged in an array, and the plurality of lens units and the plurality of first through holes overlap in a one-to-one correspondence in a direction perpendicular to the first diaphragm layer.

For example, in the collimator provided by at least one embodiment of the present disclosure, a relationship between a radius of curvature R, an aperture D and an arch height h of at least one of the lens units satisfies a formula of $R=D^2/(8*h)+h/2$.

For example, in the collimator provided by at least one embodiment of the present disclosure, the second diaphragm layer comprises a plurality of second through holes arranged in an array, and the plurality of second through holes and the plurality of first through holes overlap in a one-to-one correspondence in the direction perpendicular to the first diaphragm layer.

For example, in the collimator provided by at least one embodiment of the present disclosure, an opening diameter of a first through hole is greater than or equal to an opening diameter of a second through hole corresponding to the first through hole.

For example, in the collimator provided by at least one embodiment of the present disclosure, the collimator further comprises: a first filling layer that is transparent and between the lens array and the first diaphragm layer; and a second filling layer that is transparent and between the first diaphragm layer and the second diaphragm layer.

For example, in the collimator provided by at least one embodiment of the present disclosure, a thickness of the first filling layer is equal to a focal length of a lens unit.

For example, in the collimator provided by at least one embodiment of the present disclosure, a ratio of a thickness of the first filling layer to a thickness of the second filling layer ranges from 4 to 6.

BRIEF DESCRIPTION OF THE DRAWINGS

In order to more clearly illustrate the technical schemes of the embodiments of the present disclosure, the drawings of the embodiments will be briefly described in the following. It is obvious that the described drawings below are only related to some embodiments of the disclosure and are not limitative to the disclosure.

DETAILED DESCRIPTION

Figure 1A:
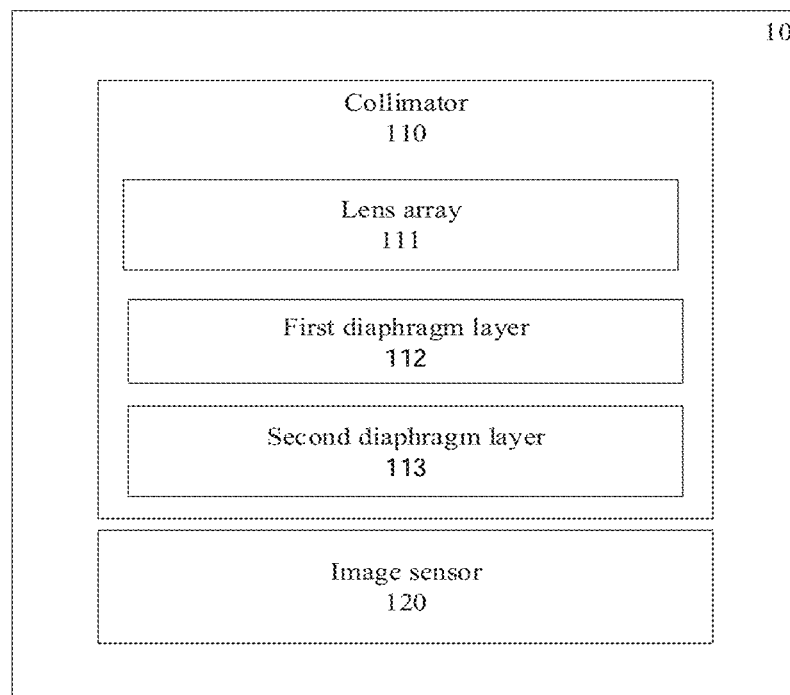
FIG. 1A is a schematic block diagram of a texture image acquiring device provided by at least one embodiment of the present disclosure.

In order to make the objects, technical schemes and advantages of the embodiments of the present disclosure more clear, the technical solutions of the embodiments of the present disclosure will be described in a clear and full way in connection with the drawings of the embodiments of the present disclosure. Obviously, the described embodiments are some embodiments of the present disclosure, not all embodiments. Based on the described embodiments of the present disclosure, all other embodiments obtained by those of ordinary skill in the art without the use of inventive faculty are within the scope of the present disclosure.

Unless otherwise defined, all the technical and scientific terms used herein have the same meanings as commonly understood by those of ordinary skill in the art to which the present disclosure belongs. The terms "first," "second," etc., which are used in the present disclosure, are not intended to indicate any sequence, amount or importance, but used to distinguish various components. Similarly, the terms, such as "a/an," "the," "one," etc., are not intended to indicate the limitation on amounts, but used to denote the presence of at least one. The terms, such as "comprise/comprising," "include/including," etc., are intended to specify that the elements or the objects stated before these terms encompass the elements or the objects and equivalents thereof listed after these terms, but not preclude other elements or objects. The terms, such as "connect/connecting/connected," "couple/coupling/coupled" etc., are not limited to a physical connection or mechanical connection, but may include an electrical connection/coupling, directly or indirectly. The terms, "on," "under," "left," "right," etc., are only used to indicate relative position relationship, and when the position of the object which is described is changed, the relative position relationship may be changed accordingly.

With respect to texture recognition, for example, during optical fingerprint recognition, in the case where a distance between a finger and an image sensor is large, the light rays reflected by the finger would scatter, which causes the image acquired by the image sensor to be blurred, so that the fingerprint information recognized according to the light rays received by the image sensor is not accurate. Thus, it is required to collimate the light rays incident on the image sensor. In technical schemes of the fingerprint recognition in the related technologies, the methods for collimating light rays include optical fiber collimation and through hole collimation, so as to accurately acquire valley information and ridge information of the fingerprint. However, the overall thickness of the optical fiber collimator in the related art is relatively thick (for example, the thickness is over 400 μm), while the general application scenario requires a thinner collimating structure (for example, the thickness is less than 100 μm). In addition, the fabrication process for a through hole collimating structure is difficult, the cost is high, and the yield is low.

Therefore, the embodiments of the present disclosure provide a texture image acquiring device having a collimating function and a thinner and lighter structure, which can improve the accuracy of the recognized texture information during the optical texture recognition.

At least one embodiment of the present disclosure provides a texture image acquiring device, and the texture image acquiring device includes a collimator and an image sensor. The collimator is stacked on the image sensor, the collimator includes a lens array, a first diaphragm layer, and a second diaphragm layer which are sequentially stacked, and the second diaphragm layer is adjacent to the image sensor. The lens array is configured to allow light rays to be converged and incident on the first diaphragm layer. The first diaphragm layer is configured to allow light rays incident on the first diaphragm layer to pass through and be incident on the second diaphragm layer, and to restrict an angle of light rays capable of passing through the first diaphragm layer. The second diaphragm layer is configured to allow light rays incident on the second diaphragm layer to pass through (for example, the light rays can be incident on the image sensor after passing through the second diaphragm layer), and to restrict an angle of light rays capable of passing through the second diaphragm layer. The image sensor is configured to sense light rays incident on the image sensor for acquiring a texture image.

At least one embodiment of the present disclosure also provides a display device, and the display device includes a display panel and the above-described texture image acquiring device which is attacked with the display panel. The display panel includes a display side and a back side which is opposite to the display side, the texture image acquiring device is on the back side of the display panel, and the collimator is between the display panel and the image sensor. The texture image acquiring device is configured to detect light rays which are reflected by an object texture on the display side of the display panel and pass through the display panel.

At least one embodiment of the present disclosure further provides a collimator, and the collimator includes a lens array, a first diaphragm layer, and a second diaphragm layer which are sequentially stacked. The lens array is configured to allow light rays to be converged and incident on the first diaphragm layer. The first diaphragm layer is configured to allow light rays incident on the first diaphragm layer to pass through and be incident on the second diaphragm layer, and to restrict an angle of light rays capable of passing through the first diaphragm layer. The second diaphragm layer is configured to allow light rays incident on the second diaphragm layer to pass through, and to restrict an angle of light rays capable of passing through the second diaphragm layer.

The collimator, the texture image acquiring device and the display device provided by the embodiments of the present disclosure have a collimating function, and can reduce light crosstalk, thereby improving the accuracy of the acquired image information. In addition, the collimator, the texture image acquiring device, and the display device also have the advantage of light and thin structure, thereby meeting the requirements for fabrication processes and application scenarios.

The embodiments of the present disclosure and examples thereof are described in detail below with reference to the accompanying drawings.

Figure 1B:
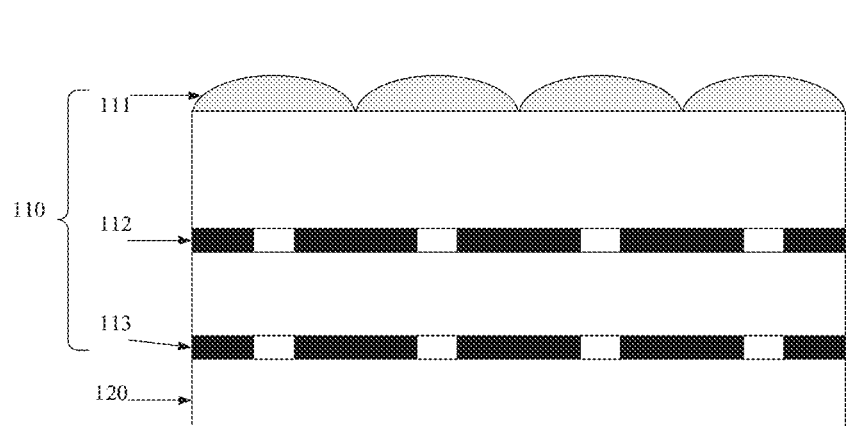
FIG. 1B is a cross-sectional view of a texture image acquiring device provided by at least one embodiment of the present disclosure.

FIG. 1A is a schematic block diagram of a texture image acquiring device provided by at least one embodiment of the present disclosure, and FIG. 1B is a cross-sectional view of a texture image acquiring device provided by at least one embodiment of the present disclosure.

For example, at least one embodiment of the present disclosure provides a texture image acquiring device 10 illustrated in FIGS. 1A and 1B. The texture image acquiring device 10 includes a collimator 110 and an image sensor 120. For example, the collimator 110 is stacked on the image sensor 120 and positioned in a light incident path of the image sensor 120. With respect to the image sensor 120, the collimator 110 includes a lens array 111, a first diaphragm layer 112, and a second diaphragm layer 113 which are sequentially stacked from top to bottom. The second diaphragm layer 113 is adjacent to the image sensor 120. For example, the lens array 111 is configured to allow light rays to be converged and incident on the first diaphragm layer 112. The first diaphragm layer 112 is configured to allow light rays to pass through and be incident on the second diaphragm layer 113, and to restrict an angle of light rays capable of passing through the first diaphragm layer 112. The second diaphragm layer 113 is configured to allow light rays to pass through, and to restrict an angle of light rays capable of passing through the second diaphragm layer 113. And the image sensor 120 is configured to sense light rays incident on the image sensor 120 for acquiring a texture image. The image sensor 120 may be an appropriate type of image sensor, such as a CMOS or CCD type of image sensor. For example, the image sensor 120 may be a silicon-based image sensor, and the manufacturing method may be, for example, an operation of manufacturing a photosensitive pixel array on a single crystal silicon wafer and then cutting the single crystal silicon wafer. Alternatively, the image sensor 120 may be a glass substrate image sensor, and the manufacturing method may be, for example, an operation of manufacturing a photosensitive pixel array on a glass substrate and then cutting the glass substrate.

It should be noted that according to actual conditions, the texture image acquiring device 10 may also include other structures or functional layers. With respect to the above-described structures or functional layers of the texture image acquiring device 10, the layers may be in direct contact with each other, or other film layers or components may be provided between the layers. In the above-described texture image acquiring device 10, the collimator 110 including the lens array 111, the first diaphragm layer 112, and the second diaphragm layer 113 can screen out (in an approximately collimating method) the light rays incident on the lens array 111 and having a particular angular range (i.e., a light receiving angel, generally a small angle), so that the screened light rays can reach the image sensor 120 below, which facilitates the detection of intensity of the light rays performed by the image sensor 120. For example, after the light rays pass through the lens array 111, the light rays are converged, and then reach the first diaphragm layer 112. The first diaphragm layer 112 can limit the angle of the light rays which can pass through the first diaphragm layer 112 (for example, the angle is in a range of 0-X, and for example, the value of X ranges from 5.7° to) 8.5°. The light rays satisfying the angle requirement can pass through the first diaphragm layer 112, while the light rays with a larger angle cannot pass through the first diaphragm layer 112, thus realizing the collimation function. After passing through the first diaphragm layer 112, the light rays reach the second diaphragm layer 113. The second diaphragm layer 113 can not only limit the angle of the light rays which can pass through the second diaphragm layer 113, but also block the light rays converged by adjacent lens units in the lens array 111, thereby preventing light crosstalk. Thus, the texture image acquiring device 10 provided by the embodiments of the present disclosure not only has a collimating function, but also can effectively prevent light crosstalk, thereby improving the accuracy of acquired image information (e.g., information for valleys and ridges of skin), and further overcoming the problem that the acquired image is blurred because of the scattering of the light rays.

It should be noted that in the embodiments of the present disclosure, the collimator 110 can also be a separate product, and the collimator 110 can be applied to any scenario requiring to collimate light rays, and the embodiments of the present disclosure are not limited thereto.

Figure 2A:
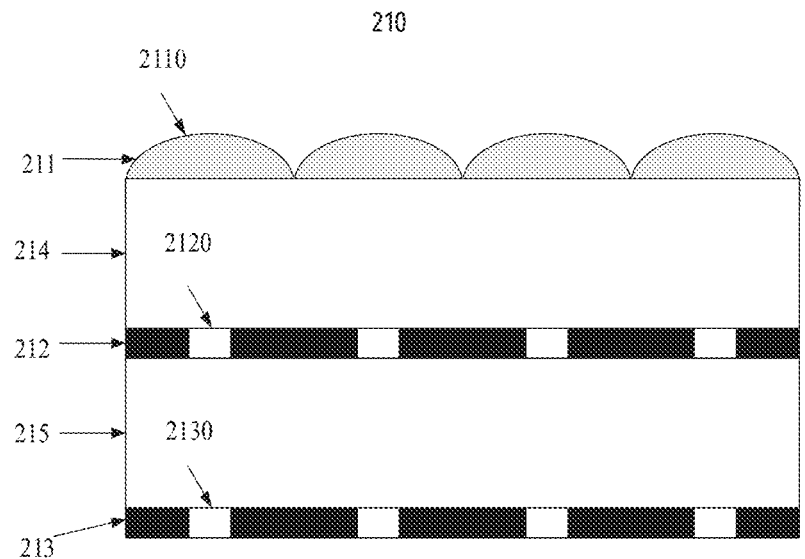
FIG. 2A is a schematic structural diagram of a collimator provided by at least one embodiment of the present disclosure.
Figure 2B:
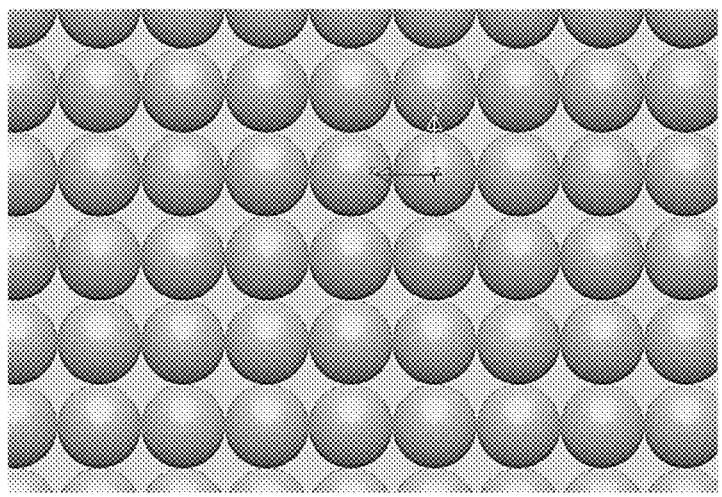
FIG. 2B is a schematic plan view of a lens array in a collimator provided by at least one embodiment of the present disclosure.
Figure 2C:
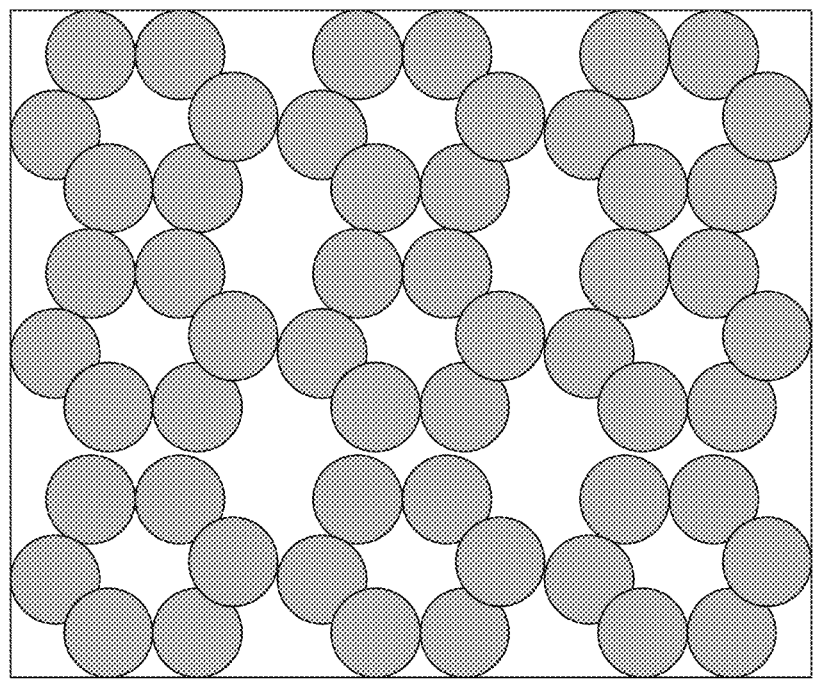
FIG. 2C is another schematic plan view of a lens array in a collimator provided by at least one embodiment of the present disclosure.
Figure 2D:
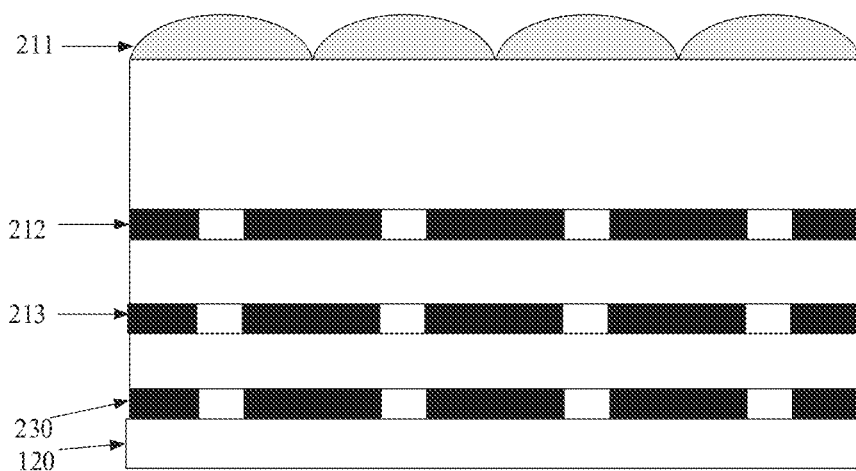
FIG. 2D is another schematic structural diagram of a collimator provided by at least one embodiment of the present disclosure.

FIG. 2A is a schematic structural diagram of a collimator 210 provided by at least one embodiment of the present disclosure, FIG. 2B is a schematic plan view of a lens array 211 in the collimator 210 provided by at least one embodiment of the present disclosure, FIG. 2C is another schematic plan view of the lens array 211 in the collimator 210 provided by at least one embodiment of the present disclosure, and FIG. 2D is another schematic structural diagram of the collimator 210 provided by at least one embodiment of the present disclosure. As illustrated in FIG. 2A, for example, in at least one embodiment of the present disclosure, the collimator 210 includes a lens array 211, a first diaphragm layer 212, and a second diaphragm layer 213 which are sequentially stacked. The lens array 211 includes a plurality of lens units 2110 arranged in an array, and the first diaphragm layer 212 includes a plurality of first through holes 2120 arranged in an array, and the plurality of lens units 2110 and the plurality of first through holes 2120 overlap in a one-to-one correspondence in a direction perpendicular to the first diaphragm layer 212.

It should be noted that the overlapping in a one-to-one correspondence between the plurality of lens units 2110 and the plurality of first through holes 2120 in the direction perpendicular to the first diaphragm layer 212 may refer to that an orthographic projection of the first through hole 2120 on the first diaphragm layer 212 overlaps with an orthographic projection of the corresponding lens unit 2110 on the first diaphragm layer 212, partly or completely. For example, the orthographic projection of the first through hole 2120 is within the orthographic projection of the corresponding lens unit 2110. The embodiments of the present disclosure are not limited thereto and can be adjusted according to actual needs.

For example, in at least one embodiment of the present disclosure, the thickness of the collimator 210 (e.g., the sum of the thicknesses of respective film layers, or the total thickness of the collimator 210) may be less than 100 e.g., in a range of 1~50 and further, e.g., in a range of 15~40 µm. The aperture size of each lens unit 2110 may be in a range of 1~40 for example, in a range of 15~30 The opening diameter of each first through hole 2120 may be in a range of 1~20 for example, in a range of 8~15 µm. The thickness of the optical fiber collimator in the related art is greater than 400 and therefore, the collimator 210 provided by the embodiments of the present disclosure has the advantage of thin and light structure, meets the requirements on the thickness of the collimator in the market, and can be applicable to various application scenarios.

For example, in at least one embodiment of the present disclosure, as illustrated in FIGS. 2A-2C, the lens array 211 may include lens units 2110 arranged in an array. According to actual application requirements, the lens unit 2110 may be a microlens, and the diameter of the microlens may be millimeter scale, micron scale or nanometer scale. For example, the microlens may be implemented as a spherical lens, an aspheric lens, or a binary optical lens (e.g., Fresnel lens), etc. For example, as illustrated in FIGS. 2A-2B, a side of the lens unit 2110 adjacent to the first diaphragm layer 212 is a planar surface. For example, in the case where each lens unit 2110 is a spherical lens or an aspheric lens, a side of the lens unit 2110 away from the first diaphragm layer 212 is a curved surface. For example, a side of the lens unit 2110 having a curved surface is a light entrance side, and a side of the lens unit 2110 having a planar surface is a light exit side. For example, the materials of the lens array 211 may include acrylic ultraviolet (UV) curing resin, epoxy UV curing resin, thermosetting resin, etc., may also be other suitable materials, and may be manufactured by an appropriate molding process, such as compression molding, photolithography molding, etc. The embodiments of the present disclosure are not limited thereto.

For example, in at least one embodiment of the present disclosure, as illustrated in FIG. 2A, the second diaphragm layer 213 in the collimator 210 includes a plurality of second through holes 2130 arranged in an array, and the plurality of second through holes 2130 and the plurality of first through holes 2120 overlap in a one-to-one correspondence in the direction perpendicular to the first diaphragm layer 212.

It should be noted that the overlapping in a one-to-one correspondence between the plurality of second through holes 2130 and the plurality of first through holes 2120 in the direction perpendicular to the first diaphragm layer 212 may refer to that an orthographic projection of the first through hole 2120 on the first diaphragm layer 212 overlaps with an orthographic projection of the corresponding second through hole 2130 on the first diaphragm layer 212, partly or completely. For example, the orthographic projection of the second through hole 2130 is within the orthographic projection of the corresponding first through hole 2120. The embodiments of the present disclosure are not limited thereto and can be adjusted according to actual needs.

It should be noted that in the embodiments of the present disclosure, the shapes of openings of the first through hole 2120 and the second through hole 2130 are not limited, and may be regular shapes such as circle, square, hexagon, etc., and may also be any irregular shapes. The cross-sectional shape of the lens unit 2110 on a plane parallel to the lens array 211 may be a regular shape such as circle, square, or hexagon, or may be any irregular shape, and the embodiments of the present disclosure are not limited thereto. For example, in an example, the shapes of the openings of the first through hole 2120 and the second through hole 2130 are both circle, and the cross-sectional shape of the lens unit 2110 on the plane parallel to the lens array 211 is also circle, so that the light intensity of the light rays converged on the image sensor 120 can be uniform in various direction, thereby further improving the accuracy of the acquired image information.

For example, as illustrated in FIGS. 2B and 2C, in the embodiments of the present disclosure, the plurality of lens units 2110 may be arranged in an array in a row alignment and column alignment manner (as illustrated in FIG. 2B), or may be arranged in an array in a particular shape (e.g., hexagon) (as illustrated in FIG. 2C), and the embodiments of the present disclosure are not limited thereto. For example, in some embodiments, in the case where the lens array 211 includes lens units 2110 arranged in a hexagonal array (as illustrated in FIG. 2C), the light rays converged on the image sensor 120 can be more sufficient, so that the accuracy of the acquired image information can be further improved.

For example, in at least one embodiment of the present disclosure, the first through hole 2120 has a first opening center and the first opening center is positioned at the focal point of the lens unit 2110 corresponding to the first through hole 2120. It should be noted that in the case where the first through hole 2120 is in a regular shape, the first opening center of the first through hole 2120 may be the geometric center, and in the case where the first through hole 2120 is in an irregular shape, the first opening center of the first through hole 2120 may be the centroid or area center of the first through hole 2120, which may be determined according to actual requirements, and the embodiments of the present disclosure are not limited thereto. For example, in some examples, in the case where the first through hole 2120 is in an irregular shape, the first opening center of the first through hole 2120 may be positioned on a main optical axis of the lens unit 2110, and the main optical axis passes through the optical center of the lens unit 2110.

For example, in at least one embodiment of the present disclosure, the first through hole 2120 has a first opening center, the second through hole 2130 has a second opening center, and the first opening center of the first through hole 2120 overlaps with the second opening center of the second through hole 2130 corresponding to the first through hole 2120 in a direction perpendicular to the first diaphragm layer 212.

It should be noted that the first opening center of the first through hole 2120 and the second opening center of the corresponding second through hole 2130 overlap in the direction perpendicular to the first diaphragm layer 212 may refer to that, for example, the first opening center of the first through hole 2120 is coaxial with the second opening center of the corresponding second through hole 2130, that is, the center of the orthographic projection of the first through hole 2120 on the first diaphragm layer 212 overlaps with the center of the orthographic projection of the corresponding second through hole 2130 on the first diaphragm layer 212. The embodiments of the present disclosure are not limited thereto and can be adjusted according to actual needs.

For example, in at least one embodiment of the present disclosure, an opening diameter of the first through hole 2120 is greater than or equal to an opening diameter of the corresponding second through hole 2130. For example, the opening diameter of the first through hole 2120 may be in a range of 1-20 µm, and the opening diameter of the second through hole 2130 may be in a range of 1-20 µm. For example, both the opening diameter of the first through hole 2120 and the opening diameter of the second through hole 2130 may be in a range of 8-15 µm. The embodiments of the present disclosure are not limited thereto and can be adjusted according to actual conditions.

For example, in at least one embodiment of the present disclosure, the plurality of lens units 2110, the plurality of first through holes 2120, and the plurality of second through holes 2130 are in a one-to-one correspondence. For example, one lens unit 2110, one first through hole 2120, and one second through hole 2130 which are corresponding to each other may be regarded as a set of collimating unit for screening out a beam of collimated light rays among the received light rays. Therefore, in this embodiment, the number of the plurality of lens units 2110, the number of the plurality of first through holes 2120, and the number of the plurality of second through holes 2130 are equal.

For example, in at least one embodiment of the present disclosure, materials of the first diaphragm layer 212 and the second diaphragm layer 213 may be light shielding materials, for example, the materials absorbing visible light (wavelength is in a range of about 380-780 nm), such as chromium, chromium oxide, black resin, and the like. For example, the light shielding material may be a metal film with a low scattering rate or the like. The embodiments of the present disclosure are not specifically limited thereto.

For example, in at least one embodiment of the present disclosure, as illustrated in FIG. 2A, the collimator 210 further includes a first filling layer 214 that is transparent and a second filling layer 215 that is transparent. The first filling layer 214 is between the lens array 211 and the first diaphragm layer 212, and the second filling layer 215 is between the first diaphragm layer 212 and the second diaphragm layer 213. The materials of the first filling layer 214 and the second filling layer 215 may be, for example, a transparent material with light transmittance over 90%, and may be an inorganic material or an organic material, and the embodiments of the present disclosure are not specifically limited thereto.

For example, in at least one embodiment of the present disclosure, according to actual requirements, in terms of the fabrication process, the lens array 211, the first diaphragm layer 212, the second diaphragm layer 213, the first filling layer 214, and the second filling layer 215 included in the collimator 210 may be cured directly above the image sensor (not illustrated in FIG. 2A), thereby completing the integration of the collimator 210. It should be noted that the embodiments of the present disclosure do not limit specific steps of the fabrication process and can be adjusted according to the actual conditions. For example, in at least one embodiment of the present disclosure, the materials of the lens array 211, the first diaphragm layer 212, the second diaphragm layer 213, the first filling layer 214, and the second filling layer 215 may be different from each other, but it is required to ensure that the refractive indices can be substantially the same or the difference between each other is small.

For example, in at least one embodiment of the present disclosure, as illustrated in FIG. 2D, the collimator 210 may include the lens array 211, the first diaphragm layer 212, the second diaphragm layer 213, and a third diaphragm layer 230 which are sequentially stacked. The third diaphragm layer 230 is between the second diaphragm layer 213 and the image sensor 120, and is configured to allow light rays to pass through and be incident on the image sensor 120, and to restrict an angle of light rays capable of passing through the third diaphragm layer 230. The specific structural design of the third diaphragm layer 230 may be referred to the above-described structures of the first diaphragm layer 212 and the second diaphragm layer 213, which may not be repeated.

Figure 3A:
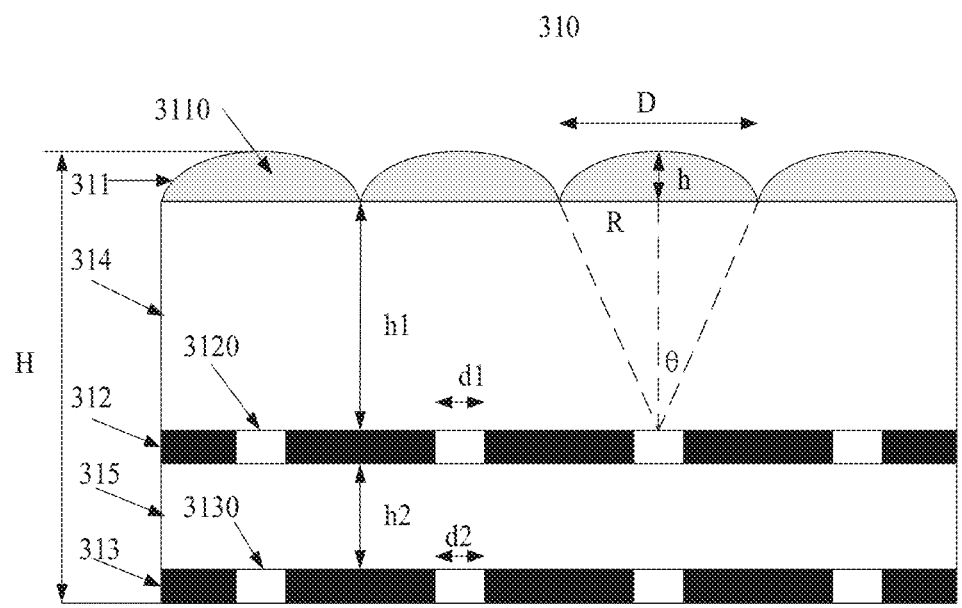
FIG. 3A is a specific structural diagram of a collimator provided by at least one exemplary embodiment of the present disclosure.
Figure 3B:
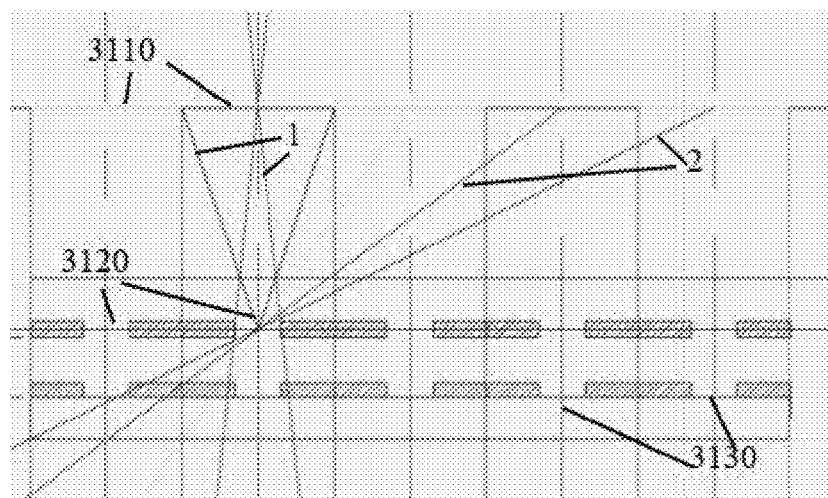
FIG. 3B is a design simulation diagram of a collimator provided by at least one exemplary embodiment of the present disclosure.
Figure 3C:
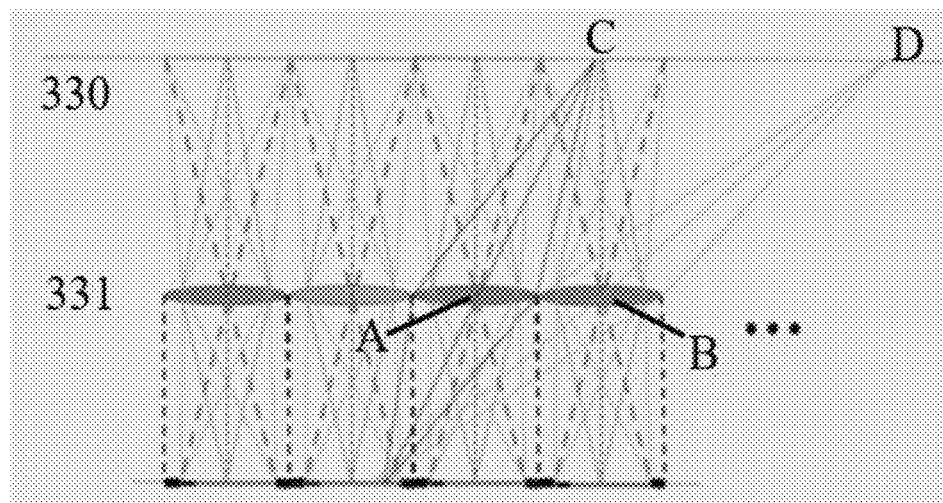
FIG. 3C and FIG. 3D are simulation result diagrams of light rays for a collimator including a single diaphragm layer provided by at least one embodiment of the present disclosure.
Figure 3D:
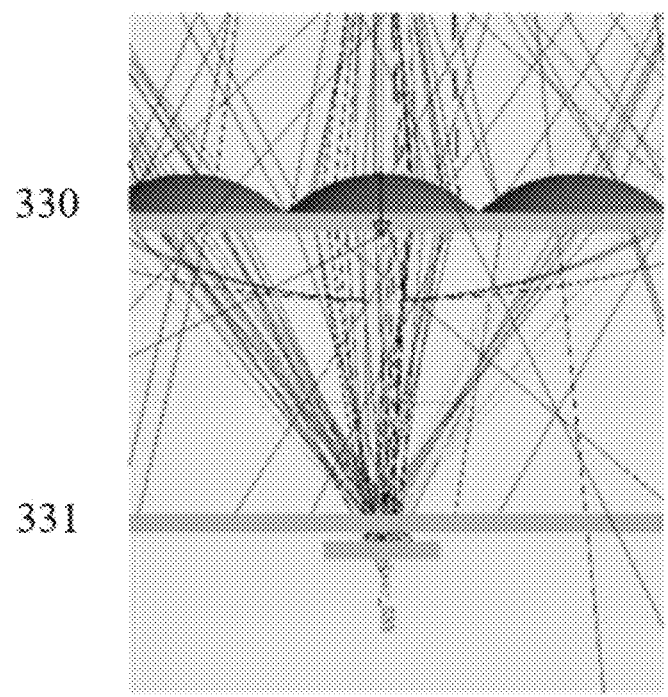
Figure 3E:
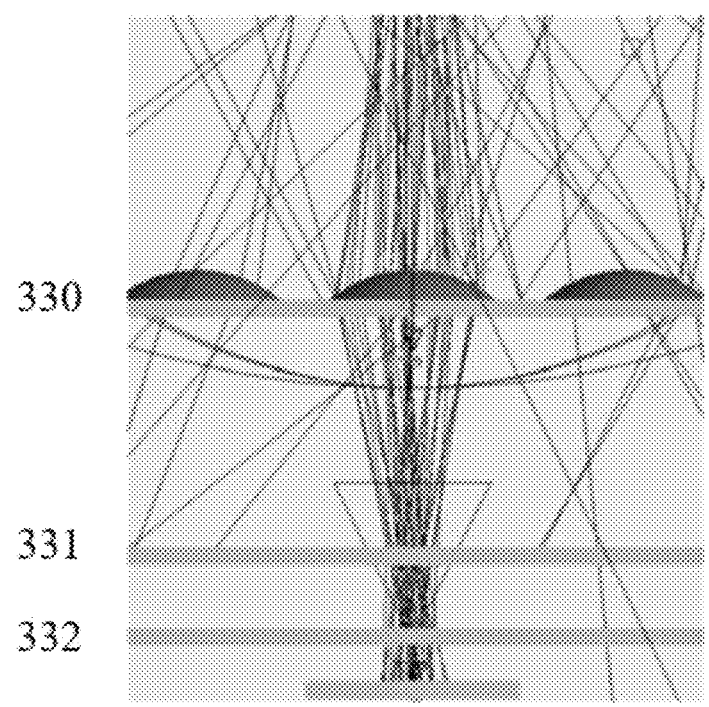
FIG. 3E is a simulation result diagram of light rays for a collimator including two diaphragm layers provided by at least one embodiment of the disclosure.

FIG. 3A is a specific structural diagram of a collimator 310 provided by at least one exemplary embodiment of the present disclosure, FIG. 3B is a design simulation diagram of a collimator 310 provided by at least one exemplary embodiment of the present disclosure, FIGS. 3C and 3D are simulation result diagrams of light rays for a collimator including a single diaphragm layer provided by at least one embodiment of the present disclosure, and FIG. 3E is a simulation result diagram of light rays for a collimator including two diaphragm layers provided by at least one embodiment of the disclosure.

For example, as illustrated in FIG. 3A, the collimator 310 includes a lens array 311, a first filling layer 314, a first diaphragm layer 312, a second filling layer 315, and a second diaphragm layer 313 which are sequentially stacked. The lens array 311 includes a plurality of lens units 3110 arranged in an array, the first diaphragm layer 312 includes a plurality of first through holes 3120 arranged in an array, and the second diaphragm layer 313 includes a plurality of second through holes 3130 arranged in an array. For example, as illustrated in FIG. 3A, the lens unit 3110 may be, for example, a microlens 3110, and in FIG. 3A, D denotes the aperture size of the microlens 3110, h denotes the arch height of the microlens 3110, R denotes the radius of curvature of the microlens 3110, f denotes the focal length of the microlens 3110, H denotes the thickness of the collimator 310, h1 denotes the thickness of the first filling layer 314, h2 denotes the thickness of the second filling layer 315, d1 denotes the aperture size of the first through hole 3120, d2 denotes the aperture size of the second through hole 3130, and angle θ denotes the light receiving angle of the first through hole 3120 (e.g., θ ranges approximately from 5.7° to 8.5°). For example, a relationship between the above-described structural parameters satisfies:

$$R=D^2/(8*h)+h/2.$$

$$d=2*(h+h1)*\tan\theta;$$

$$h+h1=f=R/(n-1),$$

where n is the refractive index of the microlens 3110;

$$H=h+h1+H2,$$

where the thicknesses of the first diaphragm layer 312 and the second diaphragm layer 313 are not greater than 1 μm, even much less than 1 μm, and thus may be negligible.

It should be noted that although the above-mentioned formulas of the present disclosure illustrate a specific relationship between structural parameters in the collimator 310, the above-mentioned specific formulas may not be strictly followed in practice. For example, respective structural parameters may be finely adjusted according to actual application requirements or according to experimental results or simulation results, so as to achieve the best effect. Therefore, the embodiments of the present disclosure do not strictly limit the specific values of the structural parameters.

For example, in at least one embodiment of the present disclosure, according to actual application requirements, the thickness H of the collimator 310 may be less than 100 μm, for example, in a range of about 1-50 μm; for example, the aperture size D of the lens unit 3110 may be in a range of about 1-25 μm; and for example, the opening diameter d1 of the first through hole 3120 of the first diaphragm layer 312 may be in a range of about 1-15 μm.

For example, in at least one embodiment of the present disclosure, the thickness h1 of the first filling layer 314 may be approximately equal to the focal length f of the lens unit 3110 (e.g., the microlens).

For example, in at least one embodiment of the present disclosure, the ratio of the thickness h1 of the first filling layer 314 to the thickness h2 of the second filling layer 315 may range from 4 to 6, for example, from 4.2 to 5.3.

For example, in at least one embodiment of the present disclosure, the opening diameter d1 of the first through hole 3120 of the first diaphragm layer 312 may be larger than the opening diameter d2 of the corresponding second through hole 3130, or may be equal to the opening diameter d2 of the corresponding second through hole 3130.

For example, in at least one embodiment of the present disclosure, the first through hole 3120 of the first diaphragm layer 312 has a first opening center, and the first opening center is positioned at the focal point of the lens unit 3110 corresponding to the first through hole 3120. It should be noted that in the case where the first through hole 3120 is in a regular shape, the first opening center of the first through hole 3120 may be the geometric center, and in the case where the first through hole 3120 is in an irregular shape, the first opening center of the first through hole 3120 may be the centroid or area center of the first through hole 3120, which may be determined according to actual requirements, and the embodiments of the present disclosure are not limited thereto. For example, in some examples, in the case where the first through hole 3120 is in an irregular shape, the first opening center of the first through hole 3120 may be positioned on a main optical axis of the lens unit 3110, and the main optical axis passes through the optical center of the lens unit 3110.

For example, in a texture image acquiring device provided by at least one embodiment of the present disclosure, the thickness of the collimator 310 is 20 μm.

For example, in the collimator 310 provided by an exemplary embodiment of the present disclosure, after adjusting various structural parameters according to the above-mentioned formulas and based on the experimental results for many times, a set of exemplary structural parameters are obtained, and each structural parameter is designed as follows:

D=10 μm;
h=2 μm;
R=7.25 μm;
d1=d2=3.05 μm;
h1=14 μm;
h2=3 μm.

Because the thicknesses of the first diaphragm layer 312 and the second diaphragm layer 313 are negligible, the thickness H of the collimator 310 is 19 μm. In practice, considering the thicknesses of the first diaphragm layer 312 and the second diaphragm layer 313, the thickness H of the collimator 310 is about 20 μm. Accordingly, a design simulation diagram of the collimator 310 can be obtained, which is illustrated in FIG. 3B. As can be seen from FIG. 3B, the microlens 3110 in the collimator 310 can converge the received light rays, the first through hole 3120 can only allow the light rays having a small angle range (e.g., θ=5.7°-8.5°) e.g., as illustrated by solid lines 1 in FIG. 3B) to pass through, and the second through hole 3130 can block the light rays from the adjacent lens units 3110 (e.g., as illustrated by solid lines 2 in FIG. 3B). Therefore, the collimator 310 provided by the embodiments of the present disclosure not only has a collimating function, but also can effectively prevent light crosstalk from adjacent lens units. In addition, the thickness H of the collimator 310 provided by at least one embodiment of the present disclosure is in a range of about 19-21 μm, which is much less than the general thickness of the general collimator, thereby meeting the requirements on thinner and lighter collimating structures in the market.

Figure 4A:
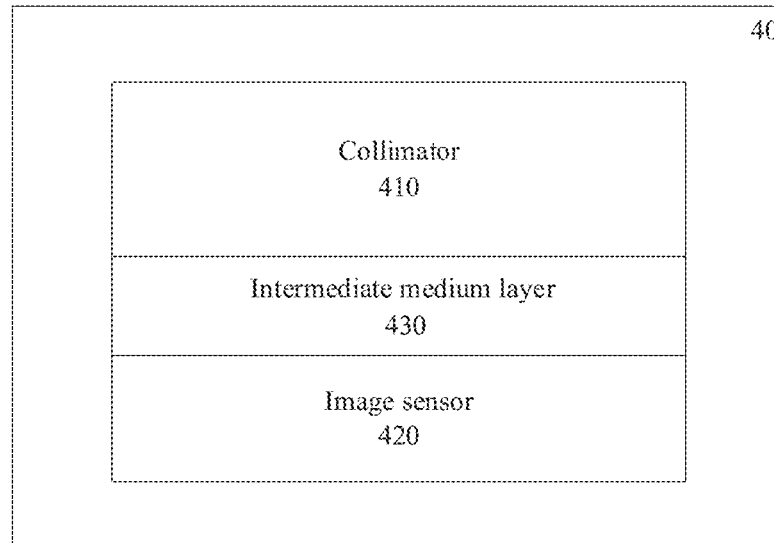
FIG. 4A is a schematic diagram of another texture image acquiring device provided by at least one embodiment of the present disclosure.
Figure 4B:
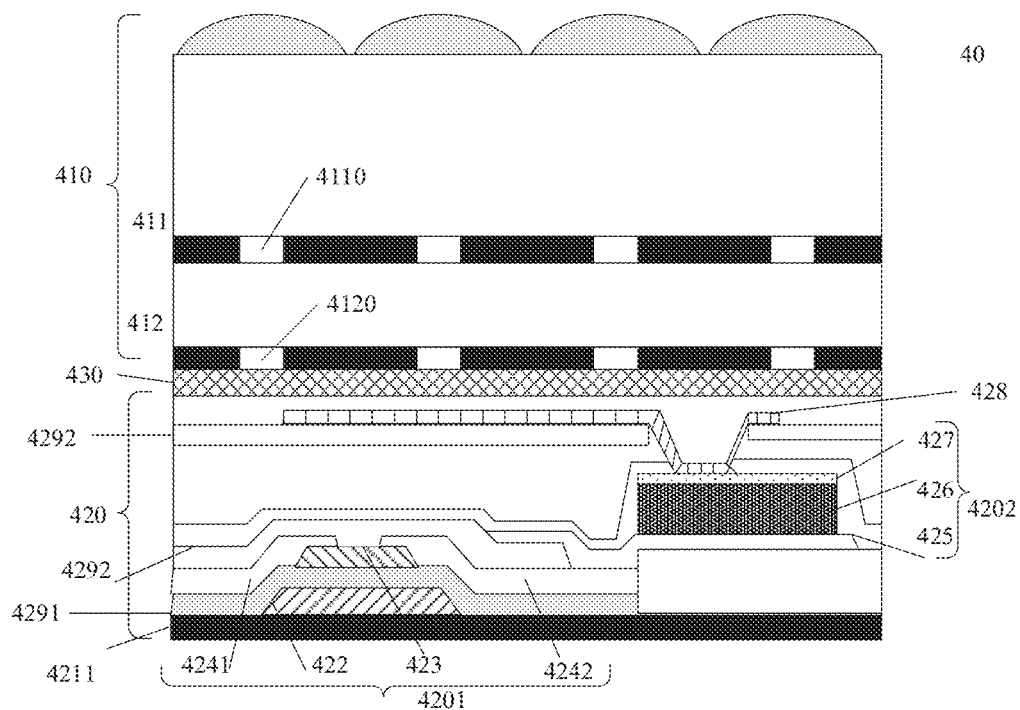
FIG. 4B is a cross-sectional view of another texture image acquiring device provided by at least one embodiment of the present disclosure.

In order to clearly describe the function of preventing light crosstalk implemented by the second diaphragm layer 313, reference may be made to FIGS. 3C-3E. For example, as illustrated in FIGS. 3C and 3D, in the case where the collimator includes only a single diaphragm layer (e.g., the first diaphragm layer 331), although each diaphragm in the single diaphragm layer 331 (e.g., diaphragm A or diaphragm B in FIG. 3C) can receive the light rays of a corresponding lens unit from, for example, the lens array 330, and can limit the angle of the light rays passing through this diaphragm, it is inevitable for this diaphragm to allow the light rays from adjacent lens units (e.g., the point C or D in FIG. 3C) to pass through. In order to effectively block the light rays from adjacent lens units, a second diaphragm layer 332 may be provided in the collimator, as illustrated in FIG. 3E. In the case where the collimator includes two diaphragm layers (e.g., the first diaphragm layer 331 and the second diaphragm layer 332), the light rays from adjacent lens units can be effectively prevented from passing through the second diaphragm layer 332. Therefore, the texture image acquiring device provided by at least one embodiment of the present disclosure can effectively improve the accuracy of the acquired image information. FIG. 4A is a schematic diagram of another texture image acquiring device provided by at least one embodiment of the present disclosure, FIG. 4B is a cross-sectional view of another texture image acquiring device provided by at least one embodiment of the present disclosure, and FIG. 4C is a plan view of an image sensor 420 in a texture image acquiring device 40 provided by at least one embodiment of the present disclosure.

For example, as illustrated in FIG. 4A, the texture image acquiring device 40 provided by at least one embodiment of the present disclosure includes a collimator 410 and an image sensor 420, and the collimator 410 is stacked on the display panel 420.

Figure 4C:
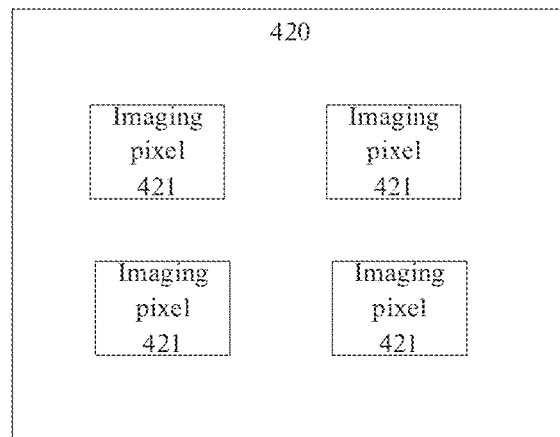
FIG. 4C is a plan view of an image sensor in a texture image acquiring device provided by at least one embodiment of the present disclosure.

For example, in at least one embodiment of the present disclosure, the image sensor 420 may include a plurality of imaging pixels 421 arranged in an array, as illustrated in FIG. 4C. For example, each imaging pixel 421 may adopt an appropriate implementation. For example, the imaging pixel 421 may include a photodiode and a switching transistor, the photodiode may convert an optical signal irradiated thereon into an electrical signal, and the switching transistor may be electrically connected to the photodiode so as to control whether the photodiode is in a state of collecting optical signals and when to collect the optical signals. For example, the type and setting mode of the photodiode can be set according to actual application requirements, and the embodiments of the present disclosure are not specifically limited thereto. For example, the photodiode may be a PIN junction type photodiode or a phototransistor, which can improve the response speed of the photodiode. For example, the imaging pixel 421 is configured to detect light rays transmitted by the collimator 410, thereby acquiring image information.

It should be noted that the embodiments of the present disclosure do not limit the specific number of the imaging pixels 421 which are included in the image sensor 420. For example, one imaging pixel 421 may be provided corresponding to one set of collimating units described above, and one imaging pixel 421 may also be provided corresponding to a plurality of sets of collimating units described above. The number of imaging pixels may be determined according to actual application requirements.

For example, in at least one embodiment of the present disclosure, as illustrated in FIG. 4B, the image sensor 420 includes an imaging pixel 421, the imaging pixel 421 may include a switching transistor 4201 and a photodiode 4202. The switching transistor 4201 and the photodiode 4202 are both provided on a base substrate 4211. For example, the switching transistor 4201 includes an active layer 423, a gate electrode 422, a first electrode 4241, and a second electrode 4242. The gate electrode 422 of the switching transistor 4201 is provided on the base substrate 4211 and covered by a first insulating layer 4291. The active layer 423 of the switching transistor 4201 is provided on the first insulating layer 4291 and covered by a second insulating layer 4292. For example, the first electrode 4241 and the second electrode 4242 of the switching transistor 4201 are symmetrically provided and may be interchanged, one of which is a source electrode and the other is a drain electrode. For example, the photodiode 4202 includes a PIN junction 426, a first electrode 425, and a second electrode 427. For example, the second electrode 427 is manufactured by using a transparent conductive material such as indium tin oxide (ITO). By adopting an appropriate structure (e.g., a cup-shaped structure), the second electrode 427 can further function as a light collecting layer, so that the light rays incident on the second electrode 427 are incident on the PIN junction 426 as much as possible. The second electrode 427 is electrically connected to a bias voltage line (not illustrated) via a metal layer 428, and the first electrode 425 is electrically connected to the second electrode 4242 of the switching transistor 4201. For example, the metal layer 428 may cover the active layer 423 of the switching transistor 4201, so as to prevent the active layer 423 in the switching transistor 4201 from being affected by external illumination, and avoid leakage currents. It should be noted that in the embodiments of the present disclosure, the switching transistor 4201 may be a top-gate-type thin film transistor, and may also be a bottom-gate-type thin film transistor, and FIG. 4B illustrates the case where the switching transistor 4201 is a bottom-gate-type thin film transistor. In the case where the above-described transistor is a top-gate-type thin film transistor, the positions of the photodiode 4202 and the switching transistor 4201 can be adjusted accordingly, or the fabrication process can be adjusted accordingly.

It should be noted that in the above embodiments of the present disclosure, the photodiode 4202 is a PIN junction type, but the embodiments of the present disclosure are not limited thereto, and the photodiode 4202 may be a PN junction type as long as the photosensitive sensitivity of the photodiode 4202 meets usage requirements. The materials of each film layer in the image sensor 420 may adopt conventional materials, and the description of each film layer may be referred to conventional designs and is not described in detail here.

It should be noted that in the stacked structure illustrated in FIG. 4B, the relative positional relationships and the dimensional proportional relationships among the various film layers are only schematic and not restrictive. In practice, the orthographic projection of the photosensitive surface of the PIN junction 426 of the photodiode 4202 on the first diaphragm layer 411 may cover the plurality of first through holes 4110, and the orthographic projection of the photosensitive surface of the PIN junction 426 of the photodiode 4202 on the second diaphragm layer 412 may cover the plurality of second through holes 4120, which can be set according to actual requirements, and the embodiments of the present disclosure are not limited thereto.

As illustrated in FIGS. 4A and 4B, a bonding manner of the collimator 410 and the image sensor 420 in the texture image acquiring device 40 provided by at least one embodiment of the present disclosure can be set according to actual application requirements, and the embodiments of the present disclosure are not specifically limited thereto. For example, the collimator 410 and the image sensor 420 may be bonded in an adhesive manner. For example, in the case where the collimator 410 and the image sensor 420 are bonded in an adhesive manner, the texture image acquiring device 40 may further include an intermediate medium layer 430. The intermediate medium layer 430 is between the collimator 410 and the image sensor 420, and the intermediate medium layer 430 has viscosity and can bond the collimator 410 and the image sensor 420. For example, the material of the intermediate medium layer 430 may include optically clear adhesive (OCA). For example, the intermediate medium layer 430 may also have a function of adjusting the distance between the collimator 410 and the image sensor 420 in a direction perpendicular to the image sensor 420. For example, the distance between the collimator 410 and the image sensor 420 in the direction perpendicular to the image sensor 420 may be adjusted by adjusting the thickness of the optically clear adhesive. For another example, the intermediate medium layer 430 may further include a transparent substrate (not illustrated in the figures), and the optically clear adhesive may be provided on both sides of the transparent substrate (for example, the transparent substrate may be inserted into the optically clear adhesive), thereby improving the capability of adjusting the distance implemented by the intermediate dielectric layer 430.

It should be noted that according to actual conditions, the texture image acquiring device 40 may also include other structures or functional layers. The layers may be in direct contact with each other or other film layers or components may be provided.

Figure 5:
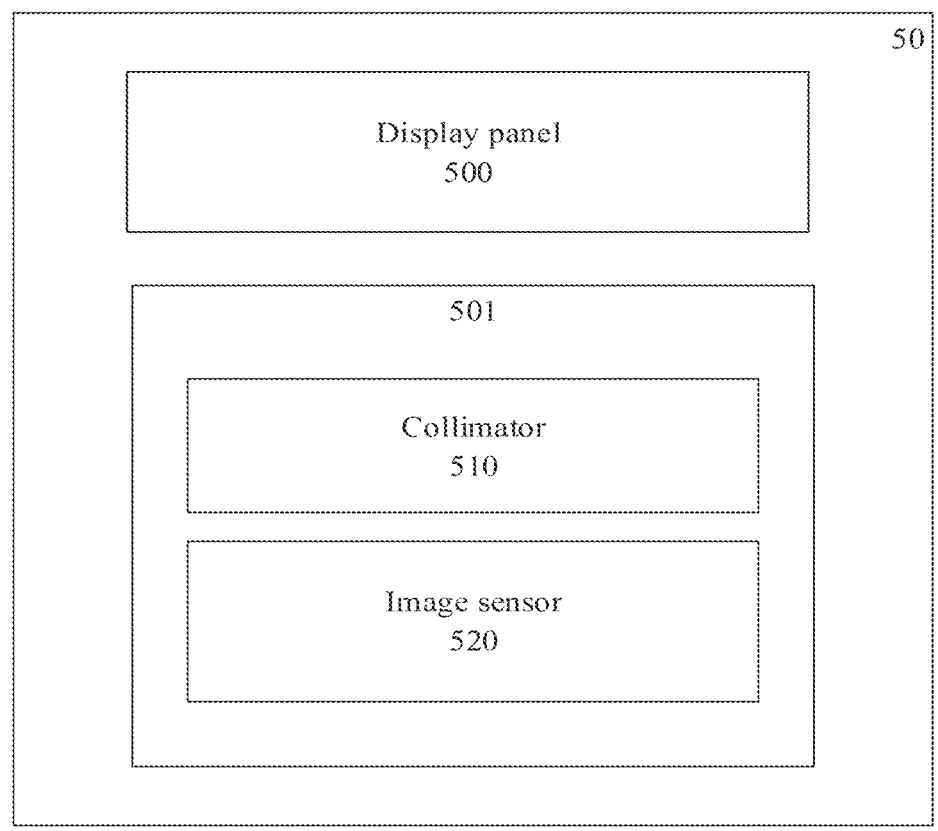
FIG. 5 is a schematic diagram of a display device provided by at least one embodiment of the present disclosure.

FIG. 5 is a schematic diagram of a display device 50 provided by at least one embodiment of the present disclosure. For example, as illustrated in FIG. 5, at least one embodiment of the present disclosure provides a display device 50, which includes a display panel 500 and a texture image acquiring device 501 stacked with the display panel 500. For example, the texture image acquiring device 501 may be the texture image acquiring device 10/40 described above. For example, the display panel 500 includes a display side and a back side which is opposite to the display side, the texture image acquiring device 501 is provided on the back side of the display panel 500, and a collimator 510 in the texture image acquiring device 501 is provided between the display panel 500 and an image sensor 520. The texture image acquiring device 501 is configured to detect the light rays which are reflected by an object texture (e.g., fingerprint, palm print, etc.) on the display side of the display panel 500 and pass through the display panel 500.

For example, in at least one embodiment of the present disclosure, the display panel 500 may be an organic light emitting diode display panel or a quantum dot light emitting diode display panel, and may also be a liquid crystal display panel. The embodiments of the present disclosure are not specifically limited thereto.

Figure 6A:
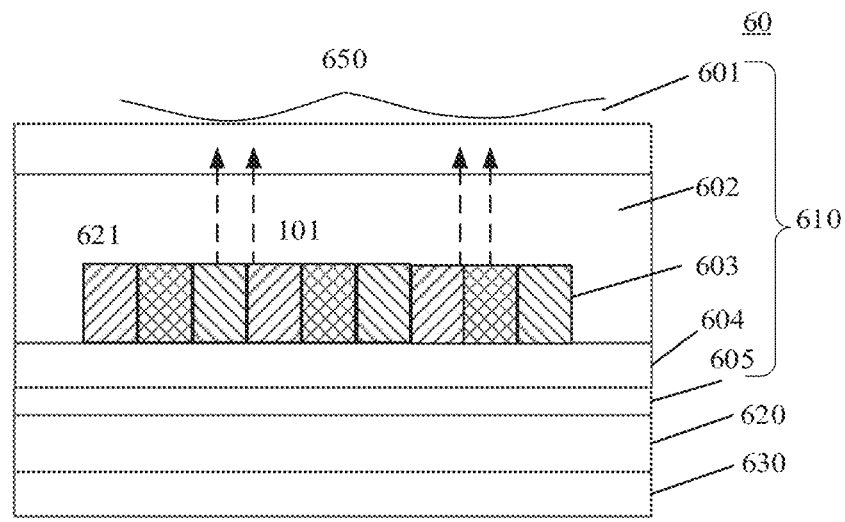
FIG. 6A is a schematic diagram of a display panel in a display device provided by at least one embodiment of the present disclosure.
Figure 6B:
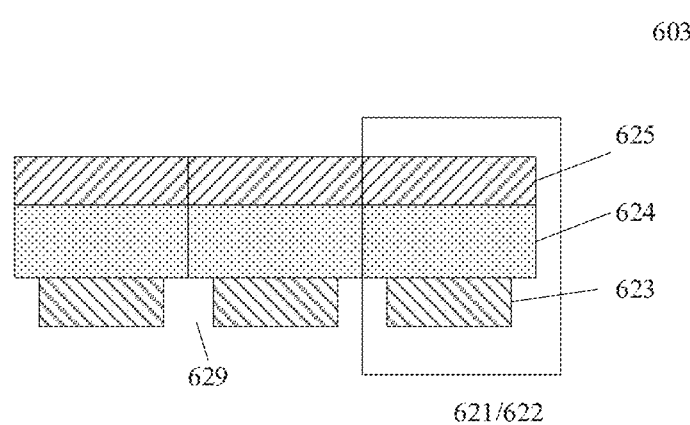
FIG. 6B is a schematic diagram of a display array layer in a display panel provided by at least one embodiment of the present disclosure.
Figure 6C:
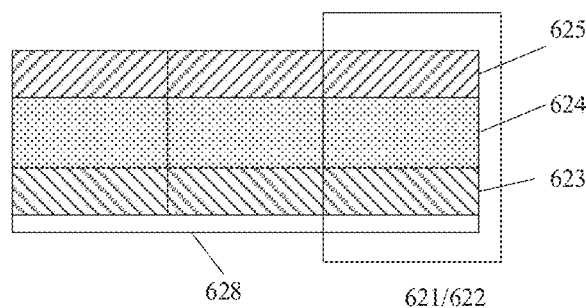
FIG. 6C is another schematic diagram of a display array layer in a display panel provided by at least one embodiment of the present disclosure.
Figure 6D:
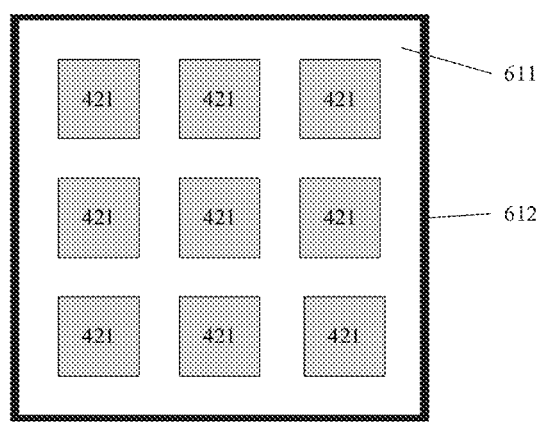
FIG. 6D is a schematic plan view of a display panel provided by at least one embodiment of the present disclosure.

FIG. 6A is a schematic diagram of a display panel 610 in a display device 60 provided by at least one embodiment of the disclosure, FIG. 6B is a schematic diagram of a display array layer 603 in a display panel 610 provided by at least one embodiment of the present disclosure, FIG. 6C is another schematic diagram of a display array layer 603 in a display panel 610 provided by at least one embodiment of the present disclosure, and FIG. 6D is a schematic plan view of a display panel 610 provided by at least one embodiment of the present disclosure.

For example, in at least one embodiment of the present disclosure, as illustrated in FIG. 6A, the display device 60 includes a display panel 610, a collimator 620 and an image sensor 630 that are stacked with the display panel 610. For example, as illustrated in FIG. 6A, in at least one embodiment of the present disclosure, the display panel 610 includes various structures such as a top layer film 601, a thin film encapsulation 602, a display array layer 603, a flexible substrate 604, and a bottom layer film 605.

For example, in at least one embodiment of the present disclosure, the bottom layer film 605 provides functions of protection and supporting for other structures and functional layers thereon, and the bottom layer film 605 is, for example, a plastic substrate or a glass substrate with high strength. The flexible substrate 604 is used to provide a function of buffering, and the flexible substrate 604 may be a flexible substrate made of polyimide (PI), polypropylene (PP), polycarbonate (PC), etc.

For example, in at least one embodiment of the present disclosure, the display array layer 603 is formed on the flexible substrate 604. For example, the display array layer 603 may include a plurality of pixel cells 621 arranged in a predetermined array and signal lines (including gate lines, data lines, detection lines, etc.) for providing electrical signals (including scanning signals, data signals, detection signals, etc.). Each pixel cell 621 includes a light emitting device (e.g., an OLED device) and a pixel driving circuit for driving the light emitting device (e.g., the OLED device) to emit light, etc. The pixel cell 621 emits light rays 101, which are used for display and, for example, function as incident light for under-screen fingerprint detection. For example, the light rays 101 emitted when the light emitting device in the pixel cell 621 is in operation are reflected by the user's skin (e.g., a finger or palm) 650 on the display side of the display panel, so as to be further used for acquiring the user's skin texture image.

For example, in at least one embodiment of the present disclosure, the thin film encapsulation 602 covers the display array layer 603, so as to prevent external water vapor from entering the display array layer 603, thereby avoiding the problems of aging or deterioration, and the thin film encapsulation 602 may be a multi-layer thin film encapsulation including, for example, laminated inorganic insulating layers, organic insulating layers, and the like.

For example, in at least one embodiment of the present disclosure, the top layer film 601 may be a cover plate, such as a substrate or a thick film made of glass or plastic, and may be used to provide the functions of supporting and protection, for example, for user's operations such as touch, press, and the like.

It should be noted that the display panel 610 may also include other structures or functional layers as required. For example, the display panel 610 may include a touch structure used for realizing a touch function. The touch structure may be built into the display array layer 603, or formed on the top layer film 601, or the like. For example, the touch structure may be capacitance-type, resistance-type, etc.

For example, in at least one embodiment of the present disclosure, as illustrated in FIGS. 6A-6C, the display array layer 603 may include a plurality of pixel cells 621 arranged in an array. For example, each pixel cell 621 may include a light emitting diode 622, which may be an organic light emitting diode, a quantum dot light emitting diode, or an inorganic light emitting diode 622, and the embodiments of the present disclosure are not specifically limited thereto.

For example, in at least one embodiment of the present disclosure, as illustrated in FIGS. 6B and 6C, each light emitting diode 622 may include a cathode 625, a light emitting layer 624, and an anode 623. For example, the light emitting diode 622 may include a reflective electrode, so that the light emitted from the light emitting diode 622 may be reflected to the display side (e.g., the top layer film 601), thereby improving the light emitting efficiency of the light emitting diode 622 and alleviating the influence on the image sensor 620. For example, with respect to the top-emission-type organic light emitting diode 622, the anode 623 may be configured to include a reflective electrode, and for example, the anode 623 may be manufactured by laminating indium tin oxide (ITO) and a metal layer. For example, as illustrated in FIG. 6B, the reflective electrode may have an opening 629, so that the light reflected on the display side can pass through. For example, the opening 629 may allow the light reflected by the top layer film 601 to pass through. For another example, the opening 629 may also allow the light reflected by finger skin 650 to pass through. In addition, no anode or cathode is provided at the portion corresponding to the opening 629, so that the portion does not emit light, thereby avoiding the influence on obtaining image information.

For example, in at least one embodiment of the present disclosure, as illustrated in FIG. 6C, the light emitting diode 622 may further include a reflective layer 628 that may reflect the light emitted by the light emitting diode 622 to the display side. In this case, the cathode 625 and the anode 623 of the light emitting diode 622 may be made of transparent conductive materials or made of metal with a thinner thickness, so that the cathode 625 and the anode 623 have transparent or semitransparent properties (e.g., the cathode 625 and the anode 623 may be made of a transparent conductive oxide material and a transparent alloy material, respectively). For example, the reflective layer 628 may be a multi-layer dielectric film that can reflect the light emitted by the light emitting diode 622, and the multi-layer dielectric film can, for example, reflect visible light. For example, according to actual application requirements, the reflective layer 628 may have an opening (not illustrated in FIG. 6C), thereby allowing the light reflected on the display side to pass through. For another example, the reflective layer 628 may have the capability of transmitting light rays with a particular wavelength band (e.g., infrared wavelength band) or a particular wavelength (e.g., 976 nm) according to actual application requirements.

For example, in at least one embodiment of the present disclosure, in the case where the display panel 610 is a liquid crystal display panel, one or more openings may be provided in a backlight source included in the liquid crystal display panel (i.e., a side close to the collimator 620), so that the light reflected on the display side can reach the collimator 620 through the openings and then reach the image sensor 630 through the collimator 620, thereby realizing the detection of light rays.

For example, in at least one embodiment of the present disclosure, as illustrated in FIG. 6D, for example, the display panel 610 may include a display region 611 and a peripheral region 612. The peripheral region 612 of the display panel 100 may be a region positioned at the edge of the display panel 610, and the display region 611 of the display panel 100 may be a region surrounded by the peripheral region 612. Referring to FIG. 4C and the related detailed description, the image sensor 420 may include a plurality of imaging pixels 421 arranged in an array, and in some embodiments, for example, the plurality of imaging pixels 421 may be arranged in an array within the display region 611 of the display panel 610. For example, the imaging pixels 421 may detect the light reflected by skin (e.g., a finger, a palm, etc.) 650 and transmitting through the collimator 620, so that image information can be acquired.

For example, in conjunction with the detailed description about FIGS. 6A-6D described above, when light emitted from the pixel cell 621 is incident on an interface of the display side (e.g., the top layer film 601) of the display panel 610, a portion of the light is reflected by the interface, another portion of the light can emit outward the display panel 610. The light emitted from the display panel 610 can be reflected in the case where the light is incident on the skin (e.g., a finger, a palm, etc.), and a portion of the reflected light can return to the display panel 610. The reflected light can be used for imaging for analysis and identification. For example, taking the display device 70 illustrated in FIG. 7 as an example, a texture image acquiring process by using the display device 70 provided by at least one embodiment of the present disclosure is described in detail below.

Figure 7:
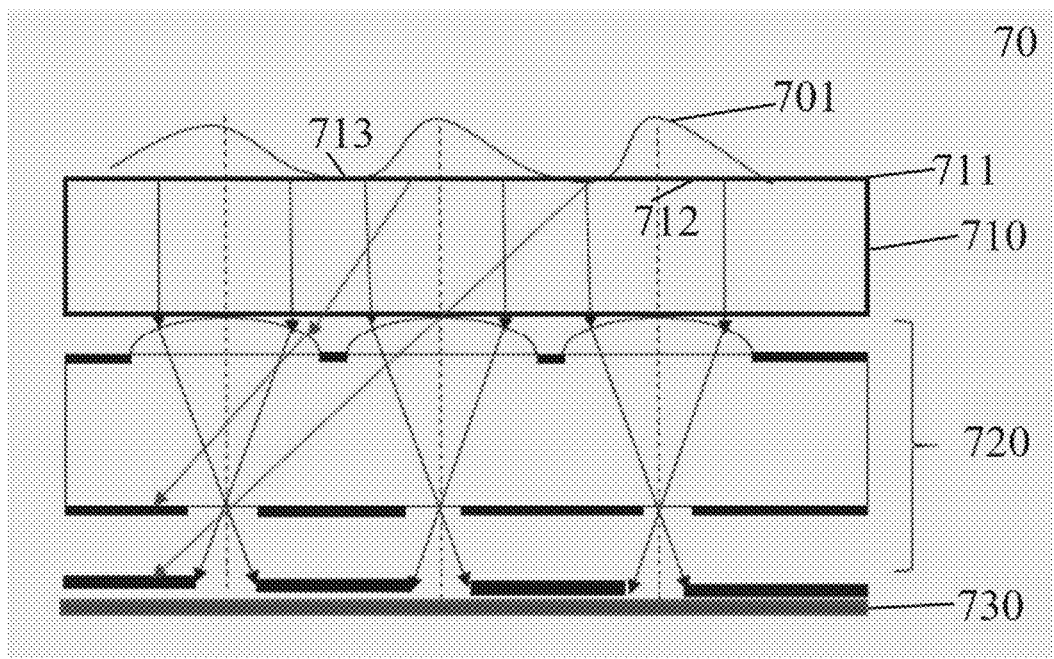
FIG. 7 is a schematic cross-sectional view of a display device provided by at least one embodiment of the present disclosure.

For example, in at least one embodiment of the present disclosure, as illustrated in FIG. 7, a fingerprint 701 of a finger includes texture formed by protrusions (i.e., fingerprint ridges) and depressions (fingerprint valleys), etc. In the case where the finger touches a display side substrate (e.g., a cover plate) 711, the fingerprint ridges touch the display side substrate 711, and the fingerprint valley do not touch the display side substrate 711. The air between the fingerprint valleys and the display side substrate 711 forms a first interface 712 with the display side substrate 711, and the fingerprint ridges (i.e., skin) form a second interface 713 with the display side substrate 711. For example, because the refractive index of skin (for example, the refractive index of skin is 1.55) is closer to the refractive index of the display side substrate 711 (for example, the refractive index is 1.5 for a general glass cover plate) than the refractive index of air (for example, the refractive index of air is 1), the intensity of the light, emitted from the pixel cell 621, reflected by the first interface 712 is greater than the intensity of the light reflected by the second interface 713. For example, in the case of normal incidence, the reflectance of an interface is Ref=$((nr-1)/(nr+1))^2$, where nr is the relative refractive index. For example, in the case where the refractive index of air, the refractive index of skin, and the refractive index of display side substrate 711 are 1, 1.55, and 1.5, respectively, the relative refractive index nr of the first interface 712 is 1.5, and the relative refractive index nr of the second interface 713 is about 0.97, and thus, the ratio of the intensity of the reflected light of the first interface 712 to that of the second interface 713 is (4%)/(0.023%)=173.9.

For example, in at least one embodiment of the present disclosure, compared with the intensity of light reflected by the interface (e.g., the first interface 712) back to the display panel 710 and incident on the image sensor 730 via the collimator 720, the intensity of light reflected by finger skin back to the display panel 710 and incident on the image sensor 730 via the collimator 720 is weaker (e.g., even negligible). Thus, in the fingerprint image acquired by the image sensor 730, the brightness of the image region corresponding to fingerprint valleys is stronger, and the brightness of the image region corresponding to fingerprint ridge is weaker.

Figure 8A:
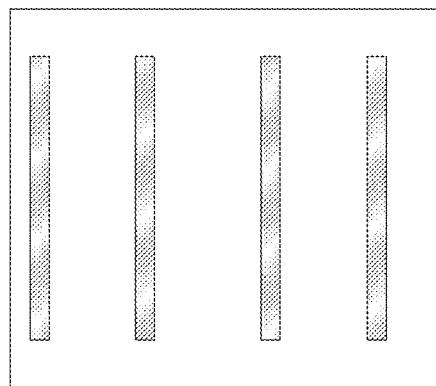
FIG. 8A is a texture simulation diagram for a display device provided by at least one embodiment of the present disclosure.
Figure 8B:
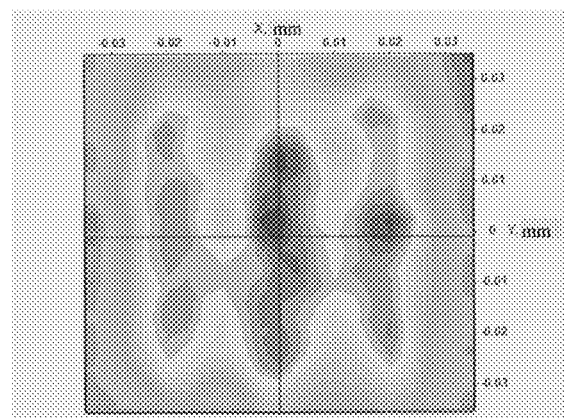
FIG. 8B is a simulation result diagram of light rays for a display device provided by at least one embodiment of the present disclosure with respect to the texture in FIG. 8A.

FIG. 8A is a texture simulation diagram provided by at least one embodiment of the present disclosure, and FIG. 8B is a simulation result diagram of light rays for a display device adopting the collimator 310 illustrated in FIG. 3A with respect to the texture illustrated in FIG. 8A. FIG. 8A includes four vertical stripes simulating skin lines, and the four vertical stripes are placed on the display side of the display panel and provided in the display region of the display side. FIG. 8B illustrates light flux detected by the image sensor. Comparing FIG. 8A with FIG. 8B, it can be seen that the light flux of the image region corresponding to the skin ridges (i.e., the vertical stripes in FIG. 8A) is weaker, while the light flux of the image region corresponding to the skin valleys (i.e., blank areas between adjacent vertical stripes in FIG. 8A) is stronger, so that the accurate information of the skin valleys and ridges can be obtained according to different light intensities detected by the image sensor for realizing texture image acquiring.

Figure 9A:
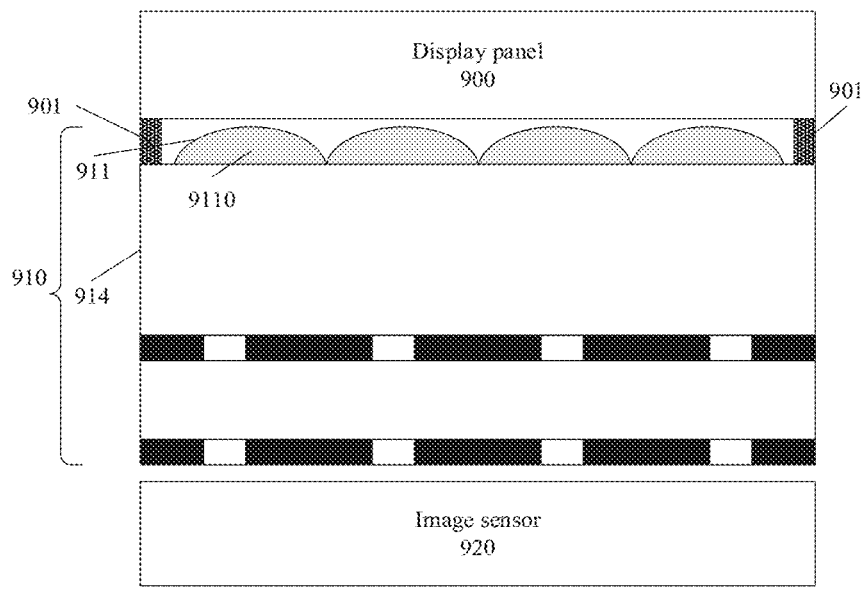
FIG. 9A is a schematic diagram of a bonding manner of a display panel and a collimator in a display device provided by at least one embodiment of the present disclosure.
Figure 9B:
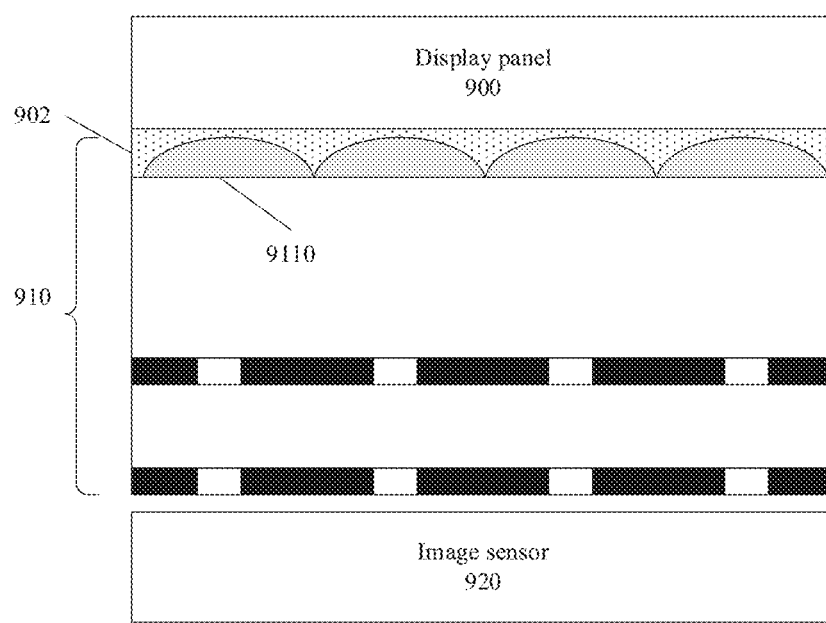
FIG. 9B is a schematic diagram of another bonding manner of a display panel and a collimator in a display device provided by at least one embodiment of the present disclosure.

FIG. 9A is a schematic diagram of a bonding manner of a display panel 900 and a collimator 910 included in a display device 90 provided by at least one embodiment of the present disclosure, and FIG. 9B is a schematic diagram of another bonding manner of the display panel 900 and the collimator 910 included in the display device 90 provided by at least one embodiment of the present disclosure.

For example, in at least one embodiment of the present disclosure, as illustrated in FIG. 9A, the display panel 900 and the collimator 910 can be bonded in a frame-bonded manner. For example, as illustrated in FIG. 9A, the display device 90 may include an adhesive frame 901 provided between the display panel 900 and the collimator 910. For example, the adhesive frame 901 may be provided between the back side of the display panel 900 (e.g., below the bottom layer film 605 illustrated in FIG. 6A) and a first filling layer 914 of the collimator 910, and positioned in a peripheral region of the display panel 900 (e.g., 612 in FIG. 6). For example, the adhesive frame 901 may bond the display panel 900 and the collimator 910 together, and may provide a function of supporting. For example, with respect to the bonding manner (frame-bonded) illustrated in FIG. 9A, the medium around a plurality of lens units (e.g., microlenses) 9110 included in the lens array 911 may be air, so the refractive index of the medium around the lens units (e.g., microlenses) 9110 is 1, while the lens unit (e.g., microlens) 9110 may be made of a material having a refractive index of a range of about 1.4 to 1.6 (e.g., 1.48 to 1.55), and the lens unit (e.g., microlens) 9110 may be made of a material such as polymethyl methacrylate (PMMA), in this case, the refractive index of the lens unit (e.g., microlens) 9110 is about 1.4918, and the embodiments of the present disclosure include, but are not limited to, this case.

For example, in at least one embodiment of the present disclosure, as illustrated in FIG. 9B, the display panel 900 and the collimator 910 can also be bonded in a surface-bonded manner. For example, in the case where the surface-bonded manner is adopted, the display panel 900 may further include a filling medium 902 provided between the display panel 900 and the collimator 910 and filled around the lens unit (e.g., microlens) 9110. For example, with respect to the bonding manner illustrated in FIG. 9B, the lens unit (e.g., microlens) 9110 may be made of a material having a refractive index of a range of about 1.7-1.9 (e.g., 1.75-1.85), the lens unit (e.g., microlens) 9110 may have a refractive index of about 1.8, and the filling medium 902 may be made of a material having a refractive index of a range of about 1.2-1.4 (e.g., 1.25-1.35), and in this case, the refractive index of the filling medium 902 may be about 1.3, for example. The embodiments of the present disclosure include this case but are not limited thereto.

It should be noted that the bonding manner of the collimator 910 and the display panel 900 can be selected according to actual application requirements, and the embodiments of the present disclosure are not specifically limited thereto.

Figure 10:
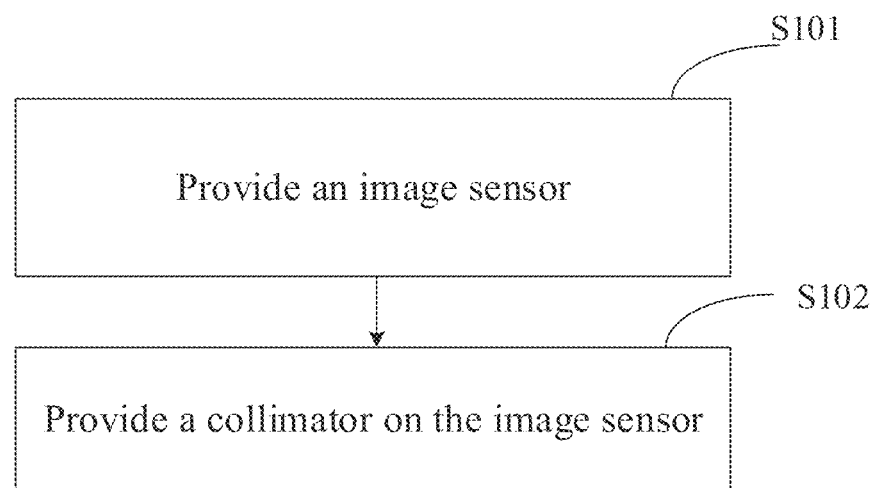
FIG. 10 is a flowchart of a method for manufacturing a texture image acquiring device provided by at least one embodiment of the present disclosure.

FIG. 10 is a flowchart of a method for manufacturing a texture image acquiring device provided by at least one embodiment of the present disclosure.

As illustrated in FIG. 10, the method for manufacturing a texture image acquiring device includes following operations:

step S101: providing an image sensor; and step S102: providing a collimator on the image sensor.

For example, in at least one embodiment of the present disclosure, providing the collimator on the image sensor includes: curing a lens array, a first diaphragm layer, a second diaphragm layer, a first filling layer, and a second filling layer included in the collimator directly on the image sensor, thereby realizing the integration of the collimator. For example, the second diaphragm layer may be formed on the image sensor and cured. Then, the second filling layer is formed on the second diaphragm layer and cured. Next, the first diaphragm layer is formed on the second filling layer and cured. Then, the first filling layer is formed on the first diaphragm layer and cured. Finally, the lens array is formed on the first filling layer and cured. As a result, each film layer can be formed integrally, thereby realizing the integration of the collimator.

For example, in at least one embodiment of the present disclosure, curing the collimator may include, but is not limited to, processes such as coating, sputtering, pre-baking, exposure, development, post-baking, etc. It should be noted that the embodiments of the present disclosure do not limit these specific steps of the manufacturing process, and the steps may be adjusted according to actual conditions. For example, in at least one embodiment of the present disclosure, by using black resin or metal with lower reflectivity (e.g., molybdenum), the first diaphragm layer and the second diaphragm layer are manufactured by exposure. For example, in at least one embodiment of the present disclosure, the first filling layer and the second filling layer are manufactured in a stepwise curing manner (the thickness of the final film is, for example, 0.05 μm). For example, in at least one embodiment of the present disclosure, an arrangement pattern of the lens array is formed by exposure, and then the lens units are formed by post-baking (e.g., the middle is thick and the edges are thin). It should be noted that the materials of the lens array, the first diaphragm layer, the second diaphragm layer, the first filling layer, and the second filling layer in the collimator may be different from each other, but it is required to ensure that the refractive indexes can be substantially the same.

For the present disclosure, the following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and features in the embodiments may be combined with each other to obtain new embodiments.

What are described above are related to the specific embodiments of the disclosure only and not limitative to the scope of the disclosure, and the scopes of the disclosure are defined by the accompanying claims.

What is claimed is:

1. A texture image acquiring device, comprising: a collimator and an image sensor,
    wherein the collimator is stacked on the image sensor, the collimator comprises a lens array and diaphragm component, wherein the diaphragm component is adjacent to the image sensor,
    the diaphragm component includes a first diaphragm layer and a second diaphragm layer;
    the lens array is configured to allow light rays to be converged and incident on the first diaphragm layer,
    the first diaphragm layer is configured to allow light rays incident on the first diaphragm layer to pass through and be incident on the second diaphragm layer, and to restrict an angle of light rays capable of passing through the first diaphragm layer,
    the second diaphragm layer is configured to allow light rays incident on the second diaphragm layer to pass through, and to restrict an angle of light rays capable of passing through the second diaphragm layer,
    the image sensor is configured to sense light rays incident on the image sensor for acquiring a texture image,
    the lens array comprises a plurality of lens units arranged in an array,
    the first diaphragm layer comprises a plurality of first through holes arranged in an array,
    the plurality of lens units and the plurality of first through holes overlap in a one-to-one correspondence in a direction perpendicular to the first diaphragm layer, and
    at least one first through hole of the first through holes has a first opening center, and the first opening center is located at a focal point of a lens unit corresponding to the first through hole.

2. The texture image acquiring device according to claim 1, wherein the plurality of lens units are arranged in a hexagonal array.

3. The texture image acquiring device according to claim 1, wherein a relationship between a radius of curvature R, an aperture D and an arch height h of at least one of the lens units satisfies a formula of $R=D^2/(8*h)+h/2$.

4. The texture image acquiring device according to claim 1,
    wherein the collimator has a thickness of less than 100 μm,
    an aperture of at least one of the lens units ranges from 1 μm to 40 μm, and
    an opening diameter of at least one of the first through holes ranges from 1 μm to 20 μm.

5. The texture image acquiring device according to claim 1,
    wherein the second diaphragm layer comprises a plurality of second through holes arranged in an array, and
    the plurality of second through holes and the plurality of first through holes overlap in a one-to-one correspondence in the direction perpendicular to the first diaphragm layer.

6. The texture image acquiring device according to claim 5, wherein at least one first through hole of the first through holes has a first opening center, at least one second through hole of the second through holes has a second opening center, and
    the first opening center of the first through hole overlaps with a second opening center of a second through hole corresponding to the first through hole in a direction perpendicular to the image sensor.

7. The texture image acquiring device according to claim 5, wherein an opening diameter of at least one first through hole of the first through holes is greater than or equal to an opening diameter of a second through hole corresponding to the first through hole.

8. The texture image acquiring device according to claim 5, wherein a number of the plurality of lens units, a number of the plurality of first through holes, and a number of the plurality of second through holes are equal.

9. The texture image acquiring device according to claim 1, further comprising a third diaphragm layer,
wherein the third diaphragm layer is between the second diaphragm layer and the image sensor, and is configured to allow light rays to pass through and be incident on the image sensor, and to restrict an angle of light rays capable of passing through the third diaphragm layer.

10. A display device, comprising:
a display panel, and
the texture image acquiring device according to claim 1 which is stacked with the display panel,
wherein the display panel comprises a display side and a back side which is opposite to the display side, the texture image acquiring device is on the back side of the display panel, and the collimator is between the display panel and the image sensor, and
the texture image acquiring device is configured to detect light rays which are reflected by an object texture on the display side of the display panel and pass through the display panel.

11. The display device according to claim 10, wherein the display panel comprises a display region and a peripheral region, and
the collimator and the image sensor are in the display region of the display panel and on the back side of the display panel.

12. The display device according to claim 11, further comprising an adhesive frame,
wherein the adhesive frame is between the display panel and the collimator, and the adhesive frame is in the peripheral region of the display panel and on the back side of the display panel.

13. The display device according to claim 11, further comprising a filling medium,
wherein the filling medium is between the display panel and the collimator, and fills a gap between the back side of the display panel and the lens array of the collimator.

14. The display device according to claim 10, wherein the display panel comprises an organic light emitting diode display panel, a quantum dot light emitting diode display panel, or a liquid crystal display panel.

15. The texture image acquiring device according to claim 1, wherein the collimator further comprises:
a first filling layer that is transparent and between the lens array and the first diaphragm layer; and
a second filling layer that is transparent and between the first diaphragm layer and the second diaphragm layer.

16. The texture image acquiring device according to claim 15, wherein a thickness of the first filling layer is equal to a focal length of at least one lens unit of the lens units.

17. The texture image acquiring device according to claim 15, wherein a ratio of a thickness of the first filling layer to a thickness of the second filling layer ranges from 4 to 6.

18. The texture image acquiring device according to claim 1, further comprising an intermediate medium layer,
wherein the intermediate medium layer is between the image sensor and the collimator, and
the intermediate medium layer is configured to bond the image sensor and the collimator, and to adjust a distance between the image sensor and the collimator in a direction perpendicular to the image sensor.

* * * * *